US 12,262,490 B2

(12) United States Patent
Kim et al.

(10) Patent No.: US 12,262,490 B2
(45) Date of Patent: Mar. 25, 2025

(54) ROLLABLE ELECTRONIC DEVICE INCLUDING RACK GEAR

(71) Applicant: Samsung Electronics Co., Ltd., Suwon-si (KR)

(72) Inventors: Bohyeon Kim, Suwon-si (KR); Myunghoon Kwak, Suwon-si (KR); Changryong Heo, Suwon-si (KR); Yangwook Kim, Suwon-si (KR); Soohyun Seo, Suwon-si (KR); Yeonggyu Yoon, Suwon-si (KR); Jookwan Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 259 days.

(21) Appl. No.: 18/076,832

(22) Filed: Dec. 7, 2022

(65) Prior Publication Data

US 2023/0217612 A1    Jul. 6, 2023

Related U.S. Application Data

(63) Continuation of application No. PCT/KR2022/017051, filed on Nov. 2, 2022.

(30) Foreign Application Priority Data

Jan. 3, 2022  (KR) .................. 10-2022-0000135
Jan. 11, 2022  (KR) .................. 10-2022-0003826

(51) Int. Cl.
  *H05K 5/02*      (2006.01)
(52) U.S. Cl.
  CPC ................. *H05K 5/0217* (2013.01)
(58) Field of Classification Search
  CPC ......... H05K 5/0217; F16H 19/04; G06F 1/16; G06F 1/1652; G06F 1/1677; G06F 1/20; G06F 1/1624; G09F 9/30
  See application file for complete search history.

(56) References Cited

U.S. PATENT DOCUMENTS 5,032,941 A  *  7/1991  Aruga .................. G11B 5/5521
                                                    360/267.2
10,747,269 B1    8/2020  Choi et al.
(Continued)

FOREIGN PATENT DOCUMENTS

CN    111069886 A  *  4/2020
CN    113746970 A     12/2021
(Continued)

OTHER PUBLICATIONS

International Search Report dated Feb. 9, 2023, issued in International Patent Application No. PCT/KR2022/017051.
(Continued)

*Primary Examiner* — Abhishek M Rathod
*Assistant Examiner* — Keon Kim
(74) *Attorney, Agent, or Firm* — Jefferson IP Law, LLP

(57) ABSTRACT

An electronic device is provided. The electronic device includes a housing including a first housing and a second housing configured to contain at least a part of the first housing and to move relative to the first housing, a display configured to unfold based on sliding of the first housing, a motor structure disposed in the housing and configured to generate driving power for sliding of the first housing, a pinion gear configured to rotate based on the driving power generated by the motor structure, and a rack gear disposed in the housing and configured to mesh with the pinion gear. The rack gear includes a first part made of a first material, the first part including at least one recess, and a second part including a lower area disposed below the first part, at least a part of the second part being contained in the at least one recess.

20 Claims, 14 Drawing Sheets

(56) References Cited

U.S. PATENT DOCUMENTS

| | | | |
|---|---|---|---|
| 11,051,413 | B2 | 6/2021 | Yang et al. |
| 11,474,565 | B2 | 10/2022 | Choi et al. |
| 2006/0207099 | A1* | 9/2006 | Mathis ................ A41H 31/005 |
| | | | 30/1 |
| 2012/0314980 | A1 | 12/2012 | Chen et al. |
| 2018/0199462 | A1 | 7/2018 | Min et al. |
| 2019/0195007 | A1* | 6/2019 | Yen ........................ E06B 7/096 |
| 2020/0262470 | A1* | 8/2020 | Kondo .................... B62D 3/12 |
| 2020/0356143 | A1 | 11/2020 | Oh et al. |
| 2021/0181801 | A1 | 6/2021 | Yin |
| 2021/0375165 | A1 | 12/2021 | Feng |
| 2021/0405703 | A1* | 12/2021 | Song .................... G06F 1/1694 |
| 2022/0087040 | A1* | 3/2022 | Song .................... G06F 1/1681 |
| 2022/0155823 | A1 | 5/2022 | Shin et al. |
| 2022/0253103 | A1* | 8/2022 | Choi ...................... G09F 9/301 |
| 2022/0308633 | A1 | 9/2022 | Yin |
| 2024/0008232 | A1 | 1/2024 | Yun et al. |

FOREIGN PATENT DOCUMENTS

| | | |
|---|---|---|
| KR | 10-2015-0037383 A | 4/2015 |
| KR | 10-2020-0129872 A | 11/2020 |
| KR | 10-2274481 B1 | 7/2021 |
| KR | 10-2021-0114533 A | 9/2021 |
| KR | 10-2021-0118850 A | 10/2021 |
| KR | 10-2021-0148396 A | 12/2021 |
| WO | 2021/015310 A1 | 1/2021 |
| WO | 2021/201309 A1 | 10/2021 |
| WO | 2022-220480 A1 | 10/2022 |

OTHER PUBLICATIONS

1 European Search Report dated Nov. 11, 2024, issued in European Application No. 22916370.4.

* cited by examiner

ROLLABLE ELECTRONIC DEVICE INCLUDING RACK GEAR

CROSS-REFERENCE TO RELATED APPLICATION(S)

This application is a continuation application, claiming priority under § 365(c), of an International application No. PCT/KR2022/017051, filed on Nov. 2, 2022, which is based on and claims the benefit of a Korean patent application number 10-2022-0000135, filed on Jan. 3, 2022, in the Korean Intellectual Property Office, and of a Korean patent application number 10-2022-0003826, filed on Jan. 11, 2022, in the Korean Intellectual Property Office, the disclosure of each of which is incorporated by reference herein in its entirety.

TECHNICAL FIELD

The disclosure relates to a rollable electronic device including a rack gear.

BACKGROUND ART

In line with development of information/communication technologies and semiconductor technologies, various functions are being incorporated in a single portable electronic device. For example, not only a communication function, but also an entertainment function (for example, gaming), a multimedia function (for example, music/video playback), communication and security functions for mobile banking and the like, a scheduling function, and an electronic wallet function may be implemented by an electronic device. Such electronic devices have become compact such that users can conveniently carry the same.

Mobile communication services have been extended to multimedia service areas, and electronic devices need to have increased display sizes such that users can sufficiently use multimedia services, in addition to voice communication or short messages. However, there is a trade-off between the display size of electronic devices and the compactness of electronic devices.

The above information is presented as background information only to assist with an understanding of the disclosure. No determination has been made, and no assertion is made, as to whether any of the above might be applicable as prior art with regard to the disclosure.

SUMMARY

Technical Solution

Aspects of the disclosure are to address at least the above-mentioned problems and/or disadvantages and to provide at least the advantages described below. Accordingly, an aspect of the disclosure is to provide a rollable electronic device including a rack gear.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a first housing and a second housing configured to accommodate at least a part of the first housing and to move relative to the first housing, a display configured to unfold based on sliding of the first housing, a motor structure disposed in the housing and configured to generate driving power for sliding of the first housing, a pinion gear configured to rotate based on the driving power generated by the motor structure, and a rack gear disposed in the housing and configured to mesh with the pinion gear. Wherein the rack gear includes a first part made of a first material, the first part including at least one recess, and a second part including a lower area disposed below the first part, at least a part of the second part being accommodated in the at least one recess, the second part being made of a second material different from the first material.

In accordance with an aspect of the disclosure, an electronic device is provided. The electronic device includes a housing including a first housing and a second housing configured to accommodate at least a part of the first housing and to move relative to the first housing, a display configured to unfold based on sliding of the first housing, a motor structure disposed in the housing and configured to generate driving power for sliding of the first housing, a pinion gear configured to rotate based on the driving power generated by the motor structure, and a rack gear disposed in the housing and configured to mesh with the pinion gear. Wherein the rack gear includes a first part made of a first material having first thermal conductivity, the first part including a through-hole and first gear teeth arranged on a periphery of the through-hole, and a second part made of a second material having second thermal conductivity higher than the first thermal conductivity, the second part including a lower area disposed below the first part and second gear teeth extending in the lower area, the second gear teeth being at least partially accommodated in the through-hole.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
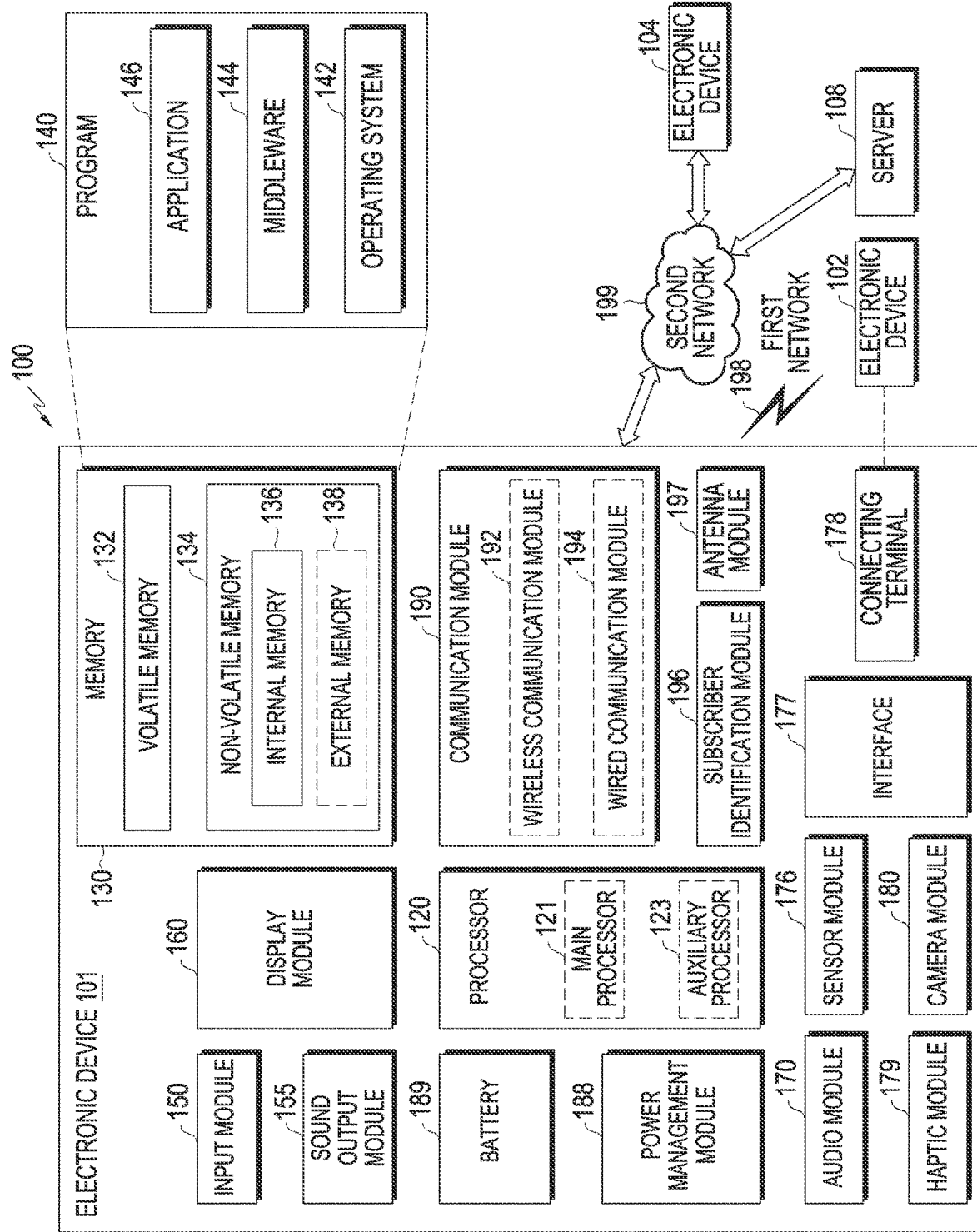
FIG. 1 is a block diagram illustrating an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include internal memory 136 and external memory 138.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a fifth-generation (5G) network, a next-generation communication network, the Internet, or a computer network (e.g., LAN or wide area network (WAN))). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a fourth-generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to an embodiment, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment, all or some of operations to be executed at the electronic device 101 may be executed at one or more external devices of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "$2^{nd}$," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively," as "coupled with," "coupled to," "connected with," or "connected to" another element (e.g., a second element), it denotes that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities, and some of the multiple entities may be separately disposed in different components. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
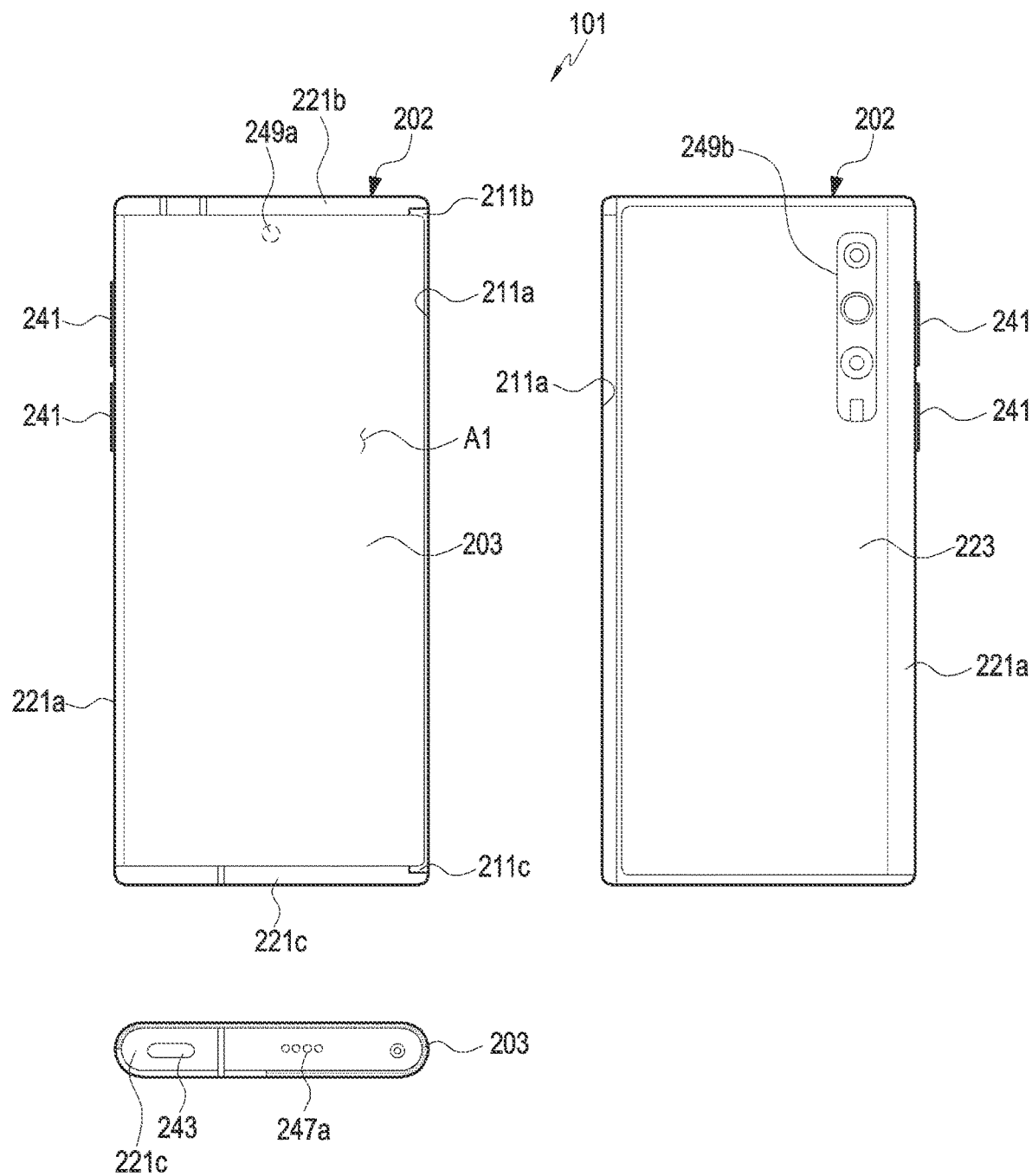
FIG. 2 is a view of an electronic device in a closed state according to an embodiment of the disclosure.

FIG. 2 is a view of an electronic device in a closed state according to an embodiment of the disclosure.

Figure 3:
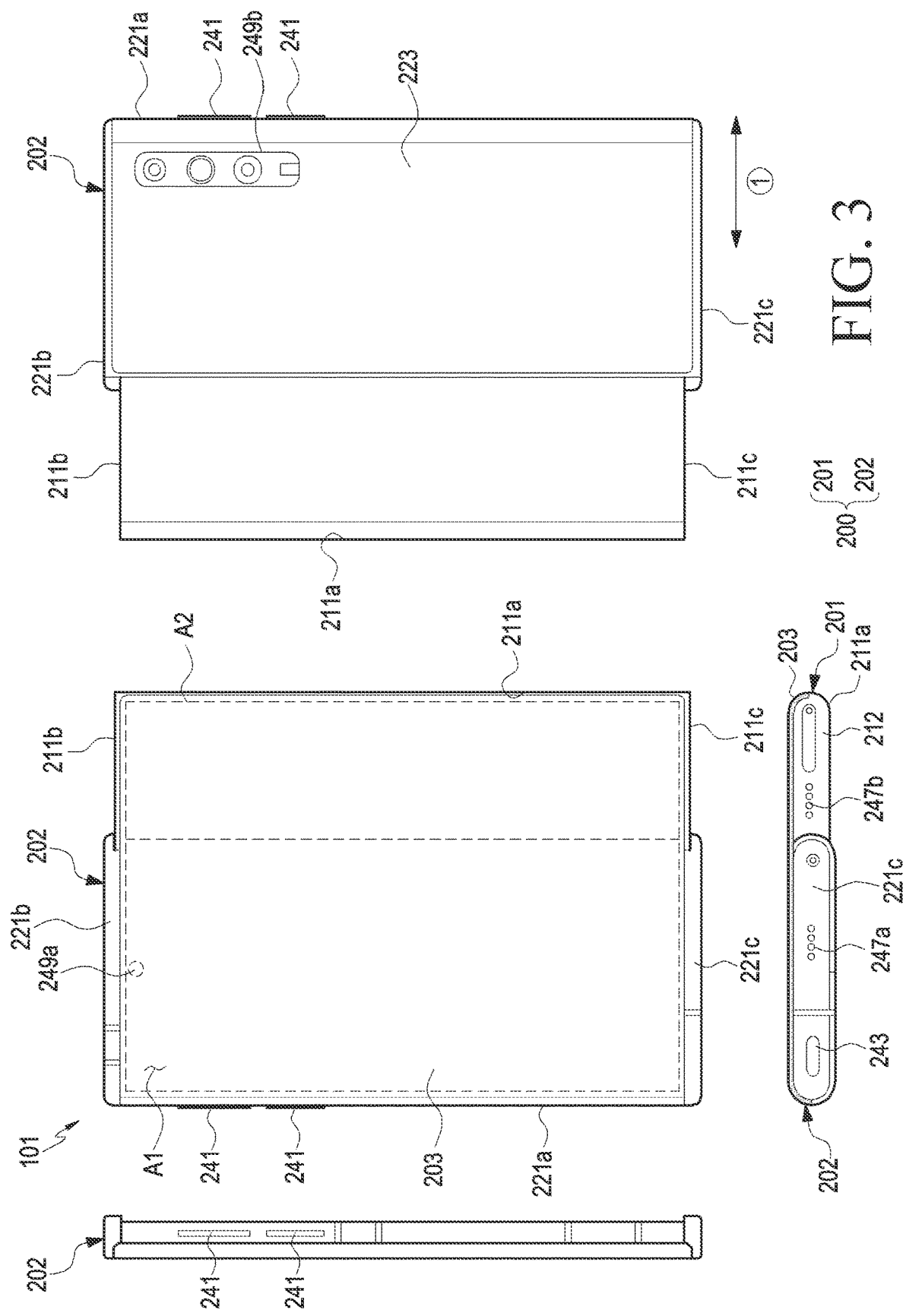
FIG. 3 is a view of an electronic device in an open state according to an embodiment of the disclosure.

FIG. 3 is a view of an electronic device in an open state according to an embodiment of the disclosure. For example, FIG. 2 is a view illustrating a state in which a second display area A2 is accommodated in a second housing 202. FIG. 3 is a view illustrating a state in which at least a part of the second display area A2 is visually exposed to the outside of the second housing 202.

It may be described that, in the state illustrated in FIG. 2, the first housing 201 is closed with regard to the second housing 202, and in the state illustrated in FIG. 3, the first housing 201 is open with regard to the second housing 202. In some embodiments, "closed state" or "opened state" may be defined as a state in which the electronic device is closed or open.

Referring to FIGS. 2 and 3, the electronic device 101 may include a housing 200. The housing 200 may include a second housing 202 and a first housing 201 which can move with regard to the second housing 202. In some embodiments, it may be interpreted that the electronic device 101 has a second housing 202 disposed to be able to slide on the first housing 201. According to an embodiment, the first housing 201 may be disposed to be able to reciprocate by a predetermined distance in a direction illustrated with reference to the second housing 202, for example, in the direction indicated by arrow ①. The configuration of the electronic device 101 in FIGS. 2 and 3 may be entirely or partially identical to the configuration of the electronic device 101 in FIG. 1.

According to an embodiment, the first housing 201 may be referred to as a first structure, a sliding portion, and a sliding housing, for example, and may be disposed to be able to reciprocate with regard to the second housing 202. According to an embodiment, the second housing 202 may be referred to as a second structure, a main portion, or a main housing, for example. The second housing 202 may accommodate at least a part of the first housing 201 and may guide the first housing 201 so as to slide. According to an embodiment, the second housing 202 may contain various electric/electronic components such as a main circuit board or a battery. According to an embodiment, at least a part (for example, first display area A1) of the display 203 may be visually exposed to the outside of the housing 200. According to an embodiment, another part (for example, second display area A2) of the display 203 may be contained inside the second housing 202 (for example, slide in), as the first housing 201 moves (for example, slides) with regard to the second housing 202, or may be visually exposed to the outside of the second housing 202 (for example, slide out). According to an embodiment, the first housing 201 may have a sub circuit board disposed therein and electrically connected to a motor, a speaker, a SIM socket, and/or a main circuit board. The second housing 202 may have a main circuit board disposed therein, on which electric components such as an application processor (AP) and a communication processor (CP) are mounted.

Figure 4:
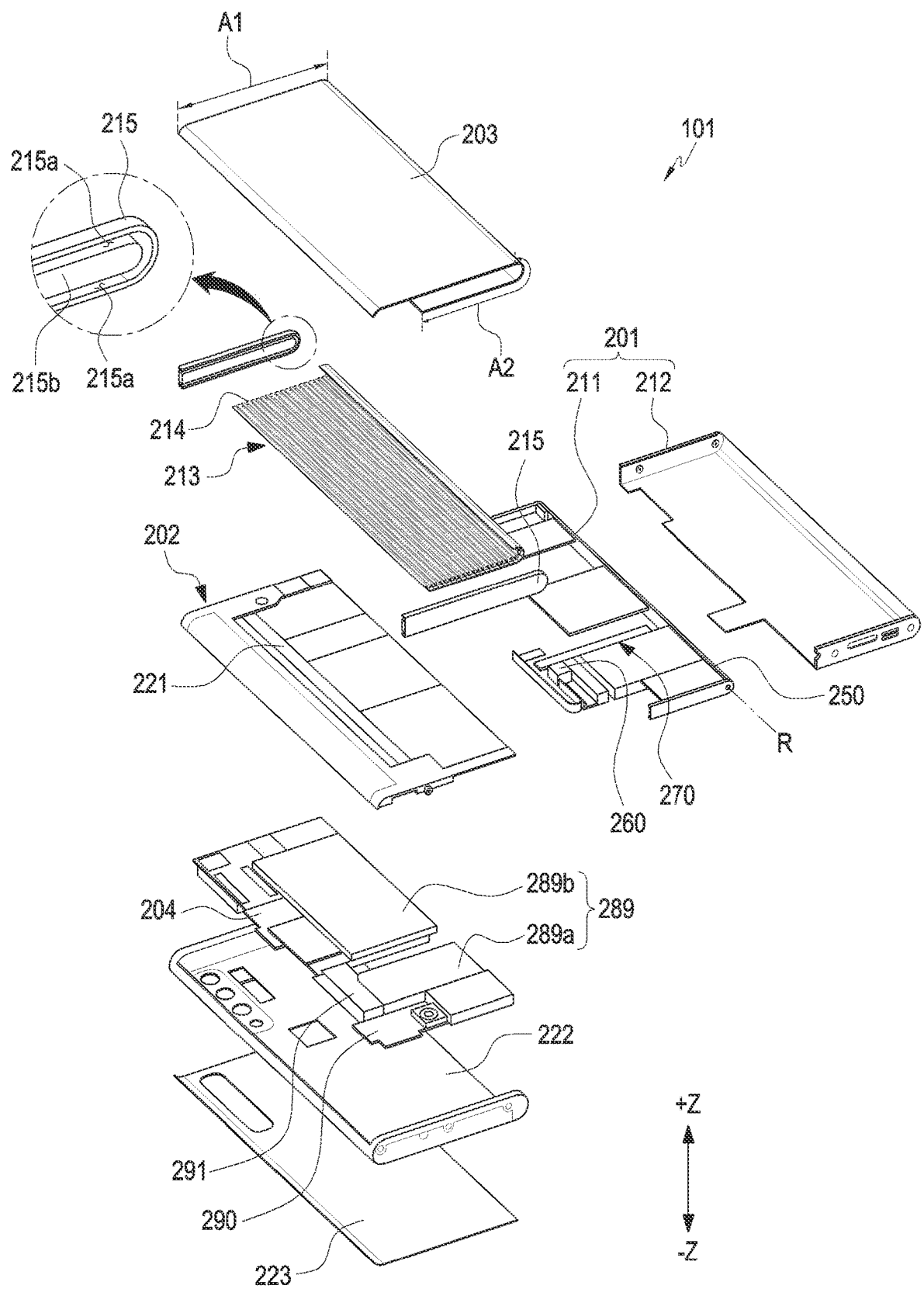
FIG. 4 is an exploded perspective view of an electronic device according to an embodiment of the disclosure.

According to an embodiment, the first housing 201 may include first side walls 211a, 211b, 211c for surrounding at least a part of the display 203 and/or a display support member (for example, display support member 213 in FIG. 4). According to an embodiment, the first side walls 211a, 211b, 211c may extend from a first plate (for example, first plate 211 in FIG. 4). The first side walls 211a, 211b, 211c may include a $(1-2)^{th}$ side wall 211b, a $(1-3)^{th}$ side wall 211c opposite to the $(1-2)^{th}$ side wall 211b, and a $(1-1)^{th}$ side wall 211a extending from the $(1-2)^{th}$ side wall 211b to the $(1-3)^{th}$ side wall 211c. For example, the $(1-2)^{th}$ side wall 211b may be position on the upper portion of the electronic device 101 (for example, (in +Y direction), and the $(1-3)^{th}$ side wall 211c may be positioned on the lower portion of the electronic device 101 (for example, in −Y direction). According to an embodiment, the $(1-1)^{th}$ side wall 211a may be substantially perpendicular to the $(1-2)^{th}$ side wall 211b and/or the $(1-3)^{th}$ side wall 211c. According to an embodiment, when the electronic device 101 is closed (for example, FIG. 2), the $(1-2)^{th}$ side wall 211b may face a $(2-2)^{th}$ side wall 221b of the second housing 202, and the $(1-3)^{th}$ side wall 211c may face a $(2-3)^{th}$ side wall 221c of the second housing 202. According to an embodiment, the $(1-1)^{th}$ side wall 211a, the $(1-2)^{th}$ side wall 211b, and/or the $(1-3)^{th}$ side wall 211c may be formed integrally with a first plate (for example, first plate 211 in FIG. 4) or a sliding cover 212. According to another embodiment, the $(1-1)^{th}$ side wall 211a, the $(1-2)^{th}$ side wall 211b, and/or the $(1-3)^{th}$ side wall 211c may formed as separate housings, which are then coupled or assembled.

According to an embodiment, the second housing 202 may include second side walls 221a, 221b, 221c for surrounding at least a part of the first housing 201. According to an embodiment, the second side walls 221a, 221b, 221c may extend from a second plate (for example, second plate 221 in FIG. 4) and/or a cover member (for example, cover member 222 in FIG. 4). According to an embodiment, the second side walls 221a, 221b, 221c may include a $(2-2)^{th}$ side wall 221b, a $(2-3)^{th}$ side wall 221c opposite to the $(2-2)^{th}$ side wall 221b, and a $(2-1)^{th}$ side wall 221a extending from the $(2-2)^{th}$ side wall 221b to the $(2-3)^{th}$ side wall 221c. For example, the $(2-2)^{th}$ side wall 221b may be position on the upper portion of the electronic device 101 (for example, (in +Y direction), and the $(2-3)^{th}$ side wall 221c may be positioned on the lower portion of the electronic device 101 (for example, in −Y direction). According to an embodiment, the $(2-1)^{th}$ side wall 221a may be substantially perpendicular to the $(2-2)^{th}$ side wall 221b and/or the $(2-3)^{th}$ side wall 221c. According to an embodiment, the $(2-2)^{th}$ side wall 221b may face the $(1-2)^{th}$ side wall 211b, and the $(2-3)^{th}$ side wall 221c may face the $(1-3)^{th}$ side wall 211c. For example, when the electronic device 101 is closed (for example, FIG. 2), the $(2-2)^{th}$ side wall 221b may cover at least a part of the $(1-2)^{th}$ side wall 211b, and the $(2-3)^{th}$ side wall 221c may cover at least a part of the $(1-3)^{th}$ side wall 211c.

According to an embodiment, the second housing 202 may be formed in a shape such that one side (for example, front surface) thereof is open so as to contain (or surround) at least a part of the first housing 201. For example, the first housing 201 may be connected to the second housing 202 while being at least partially surrounded by the $(2-1)^{th}$ side wall 221a, the $(2-2)^{th}$ side wall 221b, and the $(2-3)^{th}$ side wall 221c, and may slide in the direction of arrow ① while being guided by the second housing 202. According to an embodiment, the cover member (for example, cover member 222 in FIG. 4), the $(2\text{-}1)^{th}$ side wall 221a, the $(2\text{-}2)^{th}$ side wall 221b, and/or the $(2\text{-}3)^{th}$ side wall 221c may be formed integrally. According to another embodiment, the second cover member 222, the $(2\text{-}1)^{th}$ side wall 221a, the $(2\text{-}2)^{th}$ side wall 221b, and/or the $(2\text{-}3)^{th}$ side wall 221c may be formed as separate housings, which are then coupled or assembled.

According to an embodiment, the second housing 202 may include a rear plate 223. According to an embodiment, the rear plate 223 may form at least a part of the exterior of the electronic device 101. For example, the rear plate 223 may provide a decorative effect to the exterior of the electronic device 101.

According to an embodiment, the cover member 222 and/or the $(2\text{-}1)^{th}$ side wall 221a may cover at least a part of the display 203. For example, at least a part (for example, second display area A2) of the display 203 may be contained in the second housing 202, and the cover member 222 and/or the $(2\text{-}1)^{th}$ side wall 221a may cover a part of the display 203 contained in the second housing 202.

According to an embodiment, the electronic device 101 may include a display 203. The display 203 may be referred to as a flexible display or a rollable display. According to an embodiment, at least a part (for example, second display area A2) of the display 203 may slide based on siding of the first housing 201. According to an embodiment, the display 203 may include, or may be disposed adjacent to, a touch sensing circuit, a pressure sensor capable of measuring the intensity (pressure) of a touch, and/or a digitizer configured to detect a magnetic-type stylus pen. The configuration of the display 203 in FIGS. 2 and 3 may be entirely or partially identical to the configuration of the display module 160 in FIG. 1.

According to an embodiment, the display 203 may include a first display area A1 and a second display area A2. According to an embodiment, the first display area A1 may always be visible to the outside. According to an embodiment, the first display area A1 may be interpreted as an area that cannot be positioned inside the second housing 202. According to an embodiment, the second display area A2 may extend from the first display area A1, may be inserted or contained in the second housing 202 as the first housing 201 slides, or may be visually exposed to the outside of the second housing 202. According to an embodiment, the first display area A1 may be seated on a part (for example, first plate 211) of the first housing 201.

According to an embodiment, the second display area A2 may move while being substantially guided by a display support member (for example, display support member 213 in FIG. 4) mounted in the first housing 201 and may be contained inside the second housing 202 or in the space between the first housing 201 and the second housing 202, or may be visually exposed to the outside. According to an embodiment, the second display area A2 may move based on sliding of the first housing 201 in a width direction (for example, in the direction indicated by arrow ①). For example, at least a part of the second display area A2 may unfold or roll together with the display support member 213, based on siding of the first housing 201.

According to an embodiment, when seen from above the first housing 201, if the first housing 201 moves from a closed state to an open state, the second display area A2 may be gradually exposed to the outside of the second housing 202 so as to substantially form a plane together with the first display area A1. In an embodiment, the second display area A2 may be at least partially contained in the first housing 201 and/or the second housing 202.

According to an embodiment, the electronic device 101 may include at least one key input device 241, a connector hole 243, audio modules 247a, 247b, or camera modules 249a, 249b. Although not illustrated, the electronic device 101 may further include an indicator (for example, LED device) or various sensor modules. The configuration of the audio modules 247a, 247b and the camera modules 249a, 249b in FIGS. 2 and 3 may be entirely or partially identical to the configuration of the audio module 170 and the camera module 180 in FIG. 1.

According to an embodiment, the key input device 241 may be positioned in an area of the second housing 202. Depending on the exterior and use state, the electronic device 101 may be designed such that the illustrated key input device 241 is omitted, or additional key input device(s) are included. According to an embodiment, the electronic device 101 may include a key input device not illustrated, for example, a home key button or a touch pad disposed near the home key button. According to another embodiment (not illustrated), at least a part of the key input device 241 may be disposed on the second housing 202.

According to an embodiment, the key input device 241 may be used as a driving structure for providing sliding-in/out operations of the display 203 automatically or semi-automatically. For example, if the user presses an open trigger button (for example, key input device 241 in FIG. 2) exposed to the outside of the electronic device 101, the display 203 may automatically slide in or out (automatic operation). As another example, if the user pushes the display 203 of the electronic device 101 up to a designated section such that the same slides out, the remaining section may fully slide out via a force from an elastic member (not illustrated) mounted in the electronic device 101 (semi-automatic operation). For example, the electronic device 101 may slide out such that the same changes from a closed state (for example, FIG. 2) to an open state (for example, FIG. 3). The electronic device 101 may perform a sliding-in operation so as to correspond to the sliding-out operation described above.

According to an embodiment, the connector hole 243 may be omitted in some embodiments, and may contain a connector (for example, USB connector) for transmitting/receiving power and/or data with an external electronic device. Although not illustrated, the electronic device 101 may include multiple connector holes 243, and some of the multiple connector holes 243 may function as connection holes for transmitting/receiving audio signals with an external electronic device. In the illustrated embodiment, the connector hole 243 is disposed on the $(2\text{-}3)^{th}$ side wall 221c, but the disclosure is not limited thereto, and the connector hole 243 or another connector hole not illustrated may be disposed on the $(2\text{-}1)^{th}$ side wall 221a or the $(2\text{-}2)^{th}$ side wall 221b.

According to an embodiment, the audio modules 247a, 247b may include at least one speaker hole 247a, 247b and/or at least one microphone hole. At least one of the speaker holes 247a, 247b may be provided as an external speaker hole. At least one of the speaker holes 247a, 247b may be provided as a receiver hole for voice communication. The electronic device 101 may include a microphone for acquiring sounds, and the microphone may acquire sounds from outside the electronic device 101 through the microphone hole. According to an embodiment, the electronic device 101 may include multiple microphones in order to sense the direction of sounds. According to an embodiment, the electronic device 101 may include an audio module having speaker holes 247a, 247b and microphone holes implemented as a single hole, or may include a speaker (for example, piezo speaker) having no speaker hole 247a.

According to an embodiment, the camera modules 249a, 249b may include a first camera module 249a and/or a second camera module 249b. The second camera module 249b may be positioned in the second housing 202 so as to photograph a subject in the opposite direction to the first display area A1 of the display 203. The electronic device 101 may include multiple camera modules 249a, 249b. For example, the electronic device 101 may include at least one of a wide-angle camera, a telephoto camera, or a close-up camera, and may include an infrared projector and/or an infrared receiver in some embodiments, thereby measuring the distance to the subject. The camera modules 249a, 249b may include one or multiple lenses, an image sensor, and/or an image signal processor. The electronic device 101 may further include another camera module (for example, front camera) (for example, first camera module 249a) configured to photograph the subject in the opposite direction to the second camera module 249b. For example, the first camera module 249a may be disposed in an area which is on the periphery of the first display area A1, or which overlaps the first display area A1, and when disposed in an area overlapping the display 203, may photograph the subject through the display 203.

According to an embodiment, the indicator (for example, a light emitting diode (LED) device) of the electronic device 101 may be disposed on the first housing 201 and/or the second housing 202, and may include a light-emitting diode so as to provide a visual signal reflecting state information of the electronic device 101. The sensor module (for example, sensor module 176 in FIG. 1) of the electronic device 101 may generate an electric signal or a data value corresponding to the internal operating state of the electronic device 101, or the external environment state thereof. The sensor module may include, for example, a proximity sensor, a fingerprint sensor, or a biometric sensor (for example, iris/face recognition sensor or a heart rate monitor (HRM) sensor). In another embodiment, the electronic device 101 may include at least one of a gesture sensor, a gyro sensor, an atmospheric pressure sensor, a magnetic sensor, an acceleration sensor, a grip sensor, a color sensor, an infrared (IR) sensor, a temperature sensor, a humidity sensor, or an illuminance sensor. The configuration of the display 203, the audio modules 247a, 247b, and the camera modules 249a, 249b in FIG. 2 may be entirely or partially identical to the configuration of the display module 160, the audio module 170, and the camera module 180 in FIG. 1.

FIG. 4 is an exploded perspective view of an electronic device according to an embodiment of the disclosure.

Referring to FIG. 4, an electronic device 101 may include a first housing 201, a second housing 202, a display 203, and a display support member 213. A part (for example, second display area A2) of the display 203 may be contained in the electronic device 101 while being guided by the display support member 213. The configuration of the first housing 201, the second housing 202, and the display 203 in FIG. 4 may be entirely or partially identical to the configuration of the first housing 201, the second housing 202, and the display 203 in FIGS. 2 and/or 3.

According to an embodiment, the first housing 201 may include a first plate 211 and a sliding cover 212. The first plate 211 and the sliding cover 212 may reciprocate straight in a direction (for example, in the direction of arrow ① in FIG. 3) while being guided by the second housing 202.

According to an embodiment, the first plate 211 may slide with regard to the second housing 202, together with the sliding cover 212. For example, at least a part of the display 203 and/or at least a part of the display support member 213 may be disposed between the first plate 211 and the sliding cover 212.

According to an embodiment, the first plate 211 may support at least a part (for example, second display area A2) of the display 203. For example, the first plate 211 may include a curved surface 250, and at least a part of the second display area A2 of the display 203 may be positioned on the curved surface 250. According to an embodiment, the first plate 211 may be interpreted as a display support bar (DSB) or a display support plate (DSP).

According to an embodiment, the sliding cover 212 may protect the display 203 positioned on the first plate 211. For example, the sliding cover 212 may surround at least a part of the display 203. At least a part of the display 203 may be positioned between the first plate 211 and the sliding cover 212. According to an embodiment, the first plate 211 and the sliding cover 212 may be made of a metal material and/or a nonmetal (for example, polymer) material.

According to an embodiment, the first housing 201 may include a guide rail 215. According to an embodiment, the guide rail 215 may be connected to the first plate 211 and/or the sliding cover 212. For example, the guide rail 215 may slide with regard to the second housing 202, together with the first plate 211 and the sliding cover 212.

According to an embodiment, the electronic device 101 may include a display support member 213. According to an embodiment, the display support member 213 may support the display 203. For example, the display support member 213 may be connected to the display 203. According to an embodiment, at least a part of the display 203 and the display support member 213 may be positioned between the first plate 211 and the sliding cover 212. According to an embodiment, as the first housing 201 slides, the display support member 213 may move with regard to the second housing 202. In a closed state (for example, FIG. 2), the structure of the display support member 213 may be mostly contained in the second housing 202. According to an embodiment, at least a part of the display support member 213 may move so as to correspond to a curved surface 250 positioned on an edge of the first plate 211.

According to an embodiment, the display support member 213 may include multiple rods 214 (or bars). The multiple rods 214 may extend straight so as to be disposed in parallel to a rotational axis R defined by the curved surface 250, and may be arranged in a direction perpendicular to the rotational axis R (for example, in a direction in which the first housing 201 slides).

According to an embodiment, each rod 214 may swivel around another rod 214 adjacent thereto while remaining parallel to another rod 214 adjacent thereto. According to an embodiment, as the first housing 201 slides, the multiple rods 214 may be arranged so as to constitute a curved shape or a planar shape. For example, as the first housing 201 slides, a part of the display support member 213 facing the curved surface 250 may form a curved surface, and another part of the display support member 213 not facing the curved surface 250 may form a planar surface. According to an embodiment, the second display area A2 of the display 203 may be mounted or supported on the display support member 213 and, in an open state (for example, FIG. 3), at least a part of the second display area A2 may be exposed to the outside of the second housing 202 together with the first display area A1. When the second display area A2 is exposed to the outside of the second housing 202, the display support member 213 may substantially form a planar surface such that the second display area A2 is supported or maintained in a flat state. According to an embodiment, the display support member 213 may be replaced with a bendable integrated support member (not illustrated). According to an embodiment, the display support member 213 may be interpreted as a multi-bar structure, a display support multi-bar, or a multi joint hinge structure.

According to an embodiment, the guide rail 215 may guide movements of multiple rods 214. According to an embodiment, the guide rail 215 may include a top guide rail adjacent to the $(1-2)^{th}$ side wall (for example, $(1-2)^{th}$ side wall 211b in FIG. 3) and a bottom guide rail adjacent to the $(1-3)^{th}$ side wall (for example, $(1-3)^{th}$ side wall 211c in FIG. 3). According to an embodiment, the guide rail 215 may include a groove-shaped guide rail 215a formed inside the guide rail 215 and a protruding part 215b positioned inside the guide rail. At least a part of the protruding part 215b may be surrounded by the rail 215a. According to an embodiment, the display support member 213 may be positioned between the top guide rail and the bottom guide rail, and may move while remaining fitted/coupled to the top guide rail and the bottom guide rail. For example, top parts and/or bottom parts of the multiple rods 214 may slide along the rail 215a while remaining fitted to the rail 215a.

According to an embodiment, the size of the externally exposed area of the display 203 may increase when the electronic device 101 is opened (for example, slides out). For example, via driving of a motor structure 260 (for example, driving for sliding-out of the display) and/or an external force provided by the user, the first plate 211 connected to the motor structure 260 may slide out, and the protruding part 215b inside the guide rail 215 may push the top parts and/or bottom parts of the multiple rods 214. As a result, the display 203 which has been contained between the first plate 211 and the sliding cover 212 may expand as the front surface.

According to an embodiment, the size of the externally exposed area of the display 203 may decrease when the electronic device 101 is closed (for example, slides in). For example, via driving of a motor structure 260 (for example, driving for sliding-in of the display) and/or an external force provided by the user, the first plate 211 in which a motor is disposed may slide in, and the outer part (for example, part other than the protruding part 215b) of the guide rail 215 may push the top parts and/or bottom parts of the multiple rods 214. As a result, the display 203 which has been expanded may be contained between the first plate 211 and the sliding cover 212.

According to an embodiment, the second housing 202 may include a second plate 221, a cover member 222, and a rear plate 223. According to an embodiment, the second plate 221 may support at least a part (for example, first display area A1) of the display 203. The second plate 221 may be disposed between the display 203 and the circuit board 204. According to an embodiment, the cover member 222 may protect components (for example, battery 289 (for example, battery 189 in FIG. 1), circuit board 204) of the electronic device 101, and may protect the components of the electronic device 101. According to an embodiment, the cover member 222 may be referred to as a book cover.

According to an embodiment, the second housing 202 may contain multiple substrates. The circuit board 204 which is the main substrate may have a processor, a memory, and/or an interface mounted thereon. The processor may include, for example, at least one of a central processing device, an application processor, a graphic processing device, an image signal processor, a sensor hub processor, or a communication processor. According to an embodiment, the circuit board 204 may include a flexible printed circuit board type radio frequency cable (FRC). For example, the circuit board 204 may be disposed inside the cover member 222, and may be electrically connected to an antenna module (for example, antenna module 197 in FIG. 1) and a communication module (for example, communication module 190 in FIG. 1).

According to an embodiment, the memory may include, for example, a volatile memory or a nonvolatile memory.

According to an embodiment, the interface may include, for example, a high definition multimedia interface (HDMI), a universal serial bus (USB) interface, an SD card interface, and/or an audio interface. The interface may, for example, connect the electronic device 101 to an external electronic device electrically or physically, and may include a USB connector, an SD card/MMC connector, or an audio connector.

According to an embodiment, the electronic device 101 may further include a separate sub-circuit board 290 spaced apart from the circuit board 240 inside the second housing 202. The sub-circuit board 290 may be electrically connected to the circuit board 240 through a flexible substrate 291. The sub-circuit board 290 may be electrically connected to electric components disposed on an end of the electronic device 101, such as a battery 289 or a speaker and/or a SIM socket, so as to deliver signals and power thereto.

According to an embodiment, the battery 289 is a device for supplying power to at least one element of the electronic device 101 and may include, for example, a primary battery which is not rechargeable, or a secondary batter which is rechargeable, or a fuel cell. At least a part of the battery 289 may be disposed on a substantially identical plane with the circuit board 204, for example. The battery 289 may be disposed integrally inside the electronic device 101, or may be disposed such that the same can be attached to/detached from the electronic device 101.

According to an embodiment, the battery 289 may be formed as a single integrated battery or may include multiple separated batteries (for example, first battery 289a and second battery 289b). According to an embodiment, when the integrated battery is positioned on the first plate 211, the integrated battery may move together with sliding of the first plate 211. According to an embodiment, when the integrated battery is positioned on the second plate 221, the integrated battery may be fixedly disposed on the second plate 221 regardless of sliding of the first plate 211. As another example, when the first battery 289a among the separated batteries is positioned on the first plate 211, and when the second battery 289b among the separated batteries is fixedly positioned on the second plate 221, the first battery 289a may solely move together with sliding of the first plate 211.

According to an embodiment, the rear plate 223 may substantially form at least a part of the exterior of the electronic device 101 or the second housing 202. For example, the rear plate 223 may be coupled to the outer surface of the cover member 222. According to an embodiment, the rear plate 223 may be formed integrally with the cover member 222. According to an embodiment, the rear plate 223 may provide a decorative effect to the exterior of the electronic device 101. The second plate 221 and the cover member 222 may be fabricated by using at least one of a metal or a polymer, and the rear plate 223 may be fabricated by using at least one of a metal, glass, synthetic resin, or ceramic. According to an embodiment, the second plate 221, the cover member 222, and/or the rear plate 223 may be at least partially (for example, auxiliary display area) made of a light-transmitting material. For example, while a part (for example, second display area A2) of the display 203 remains contained in the electronic device 101, the electronic device 101 may output visual information by using the second display area A2. The auxiliary display area may be a part of the second plate 221 on which the display 203 is positioned when contained in the second housing 202, the cover member 222, and/or the rear plate 223.

According to an embodiment, the electronic device 101 may include a motor structure 260 and a gear assembly 270 such that the electronic device 101 can slide. The motor structure 260 may include a motor core for generating power. The gear assembly 270 may receive at least a part of driving power generated by the motor structure 260 and may move and/or rotate accordingly. The first housing 201 may receive at least a part of the driving power generated by the motor structure 260 through the gear assembly 270 and may move relative to the second housing 202.

The electronic device 101 illustrated in FIGS. 2 to 4 has a rollable or slidable exterior, but the disclosure is not limited thereto. According to an embodiment (not illustrated), at least a part of the electronic device illustrated may be rolled in a scroll shape.

Referring to FIGS. 2 to 4, when seen from the front of the electronic device 101, the display 203 may expand in the rightward direction of the electronic device 101. However, the structure of the electronic device 101 is not limited thereto. For example, according to an embodiment, the display 203 may expand in the leftward direction of the electronic device 101. According to another embodiment, the display 203 may expand in the longitudinal direction of the electronic device 101.

Figure 5:
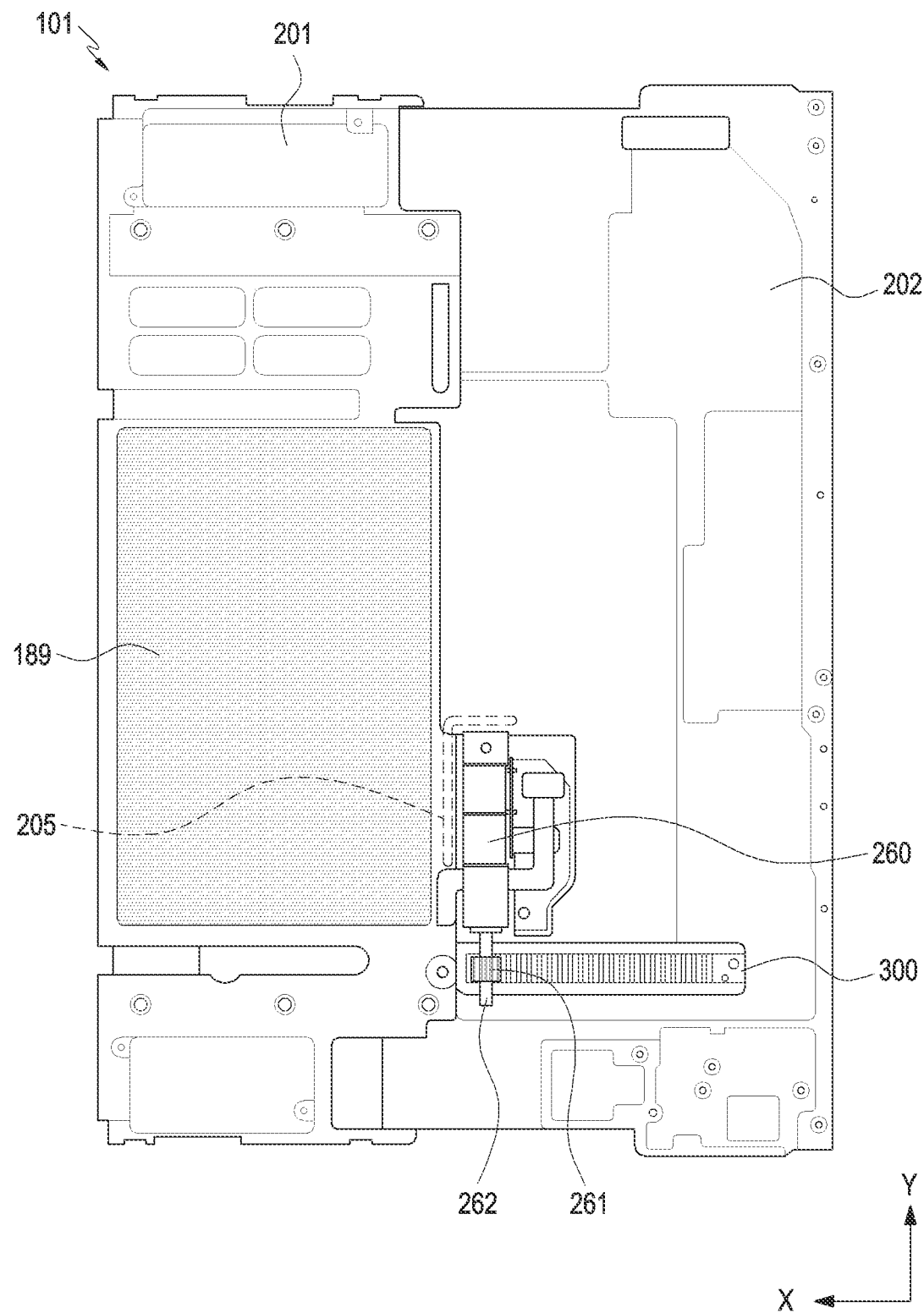
FIG. 5 is a front view of an electronic device including a motor structure, a pinion gear, and a rack gear according to an embodiment of the disclosure.
Figure 6:
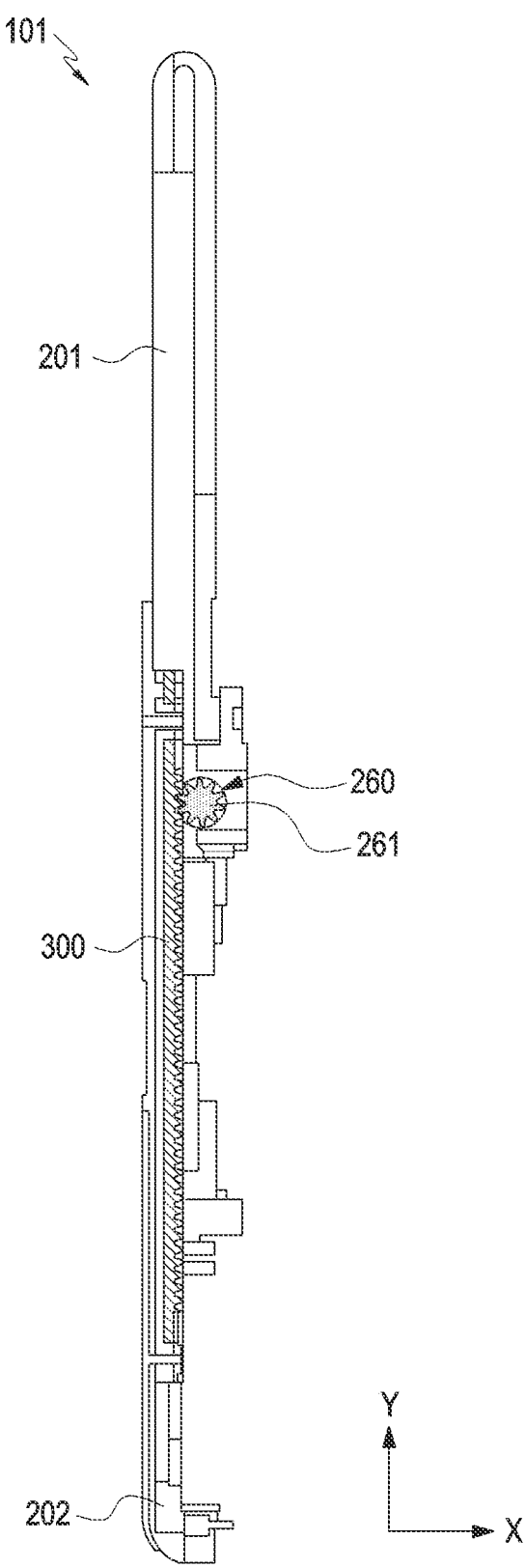
FIG. 6 is a side view of an electronic device including a motor structure, a pinion gear, and a rack gear according to an embodiment of the disclosure.

FIG. 5 is a front view of an electronic device including a motor structure, a pinion gear, and a rack gear according to an embodiment of the disclosure. FIG. 6 is a side view of an electronic device including a motor structure, a pinion gear, and a rack gear according to an embodiment of the disclosure.

Referring to FIGS. 5 and/or 6, an electronic device 101 may include a battery 189, a first housing 201, a second housing 202, a motor structure 260, a pinion gear 261, and a rack gear 300. The configuration of the battery 189, the first housing 201, the second housing 202, and the motor structure 260 in FIGS. 5 and/or 6 may be entirely or partially identical to the configuration of the battery 189, the first housing 201, the second housing 202, and the motor structure 260 in FIG. 4. The configuration of the pinion gear 261 and/or the rack gear 300 in FIGS. 5 and/or 6 may be entirely or partially identical to the configuration of the gear assembly 270 in FIG. 4.

According to an embodiment, the motor structure 260 may generate power for sliding of the electronic device 101. For example, the motor structure 260 may include a motor core capable of converting electric energy into kinetic energy (for example, rotational energy). According to an embodiment, the motor structure 260 may be connected to the pinion gear 261, and may transfer driving power to the pinion gear 261. For example, the motor structure 260 may be connected to a shaft structure 262, and the pinion gear 261 may be rotatably connected to the motor structure 260 by using the shaft structure 262.

According to an embodiment, at least a part of heat generated by the motor structure 260 may be transferred to the pinion gear 261 through the shaft structure 262. According to an embodiment, the shaft structure 262 may include a material (for example, copper (Cu)) for improving heat transfer.

According to an embodiment, the motor structure 260 may be controlled by a processor (for example, processor 120 in FIG. 1). For example, the processor 120 may include a motor driver driving circuit, and may provide the motor structure 260 with a pulse width modulation (PWM) signal for controlling the speed of the motor structure 260 and/or the torque of the motor structure 260. According to an embodiment, the motor structure 260 may be electrically connected to a processor (for example, processor 120 in FIG. 1) positioned on a circuit board (for example, circuit board 204 in FIG. 4) by using a flexible printed circuit board.

According to an embodiment, the pinion gear 261 and/or the rack gear 300 may transfer at least a part of driving power generated by the motor structure 260. For example, the pinion gear 261 and/or the rack gear 300 may transfer driving power for sliding-in and/or sliding-out of the electronic device 101 to the first housing 201 and/or the second housing 202. According to an embodiment, the first housing 201 may move relative to the second housing 202 by using the motor structure 260, the pinion gear 261, and/or the rack gear 300.

According to an embodiment, the pinion gear 261 may be connected to the motor structure 260 and may rotate based on rotation of the motor core of the motor structure 260. According to an embodiment, when the electronic device 101 slides out and/or slides in, the pinion gear 261 may rotate following the shaft structure 262. According to an embodiment, the pinion gear 261 may be a spur gear. According to an embodiment, the pinion gear 261 may mesh with the rack gear 300.

According to an embodiment, the rack gear 300 may be connected to a housing differently from the motor structure 260. For example, the rack gear 300 may be connected to the second housing 202, and the motor structure 260 may be connected to the first housing 201. According to an embodiment, when the pinion gear 261 rotates via driving power generated by the motor structure 260, the motor structure 260 and the pinion gear 261 may move relative to the rack gear 300. According to an embodiment, the rack gear 300 may be connected to a part (for example, second plate 221 in FIG. 4) of the second housing 202, and the motor structure 260 may be connected to a part (for example, first plate 211 in FIG. 4) of the first housing 201. According to another embodiment, the motor structure 260 may be connected to a part (for example, second plate 221 in FIG. 4) of the second housing 202, and the rack gear 300 may be connected to a part (for example, first plate 211 in FIG. 4) of the first housing 201.

According to an embodiment, the electronic device 101 may include at least one slit 205 for controlling the path of heat generated by the motor structure 260. For example, the slit 205 may be an empty space, and the thermal conductivity of the slit 205 may be lower than the thermal conductivity of the first housing 201 and/or the second housing 202. According to an embodiment, the slit 205 may be arranges to prevent overheating of electronic components of the electronic device 101. For example, the slit 205 may be arranged so as to surround the periphery of an electronic component, overheating of which is to be prevented. According to an embodiment, the slit 205 may surround at least a part of the battery 189. According to an embodiment, the slit 205 may be a through-hole or groove formed in the first housing 201 and/or the second housing 202.

Figure 7:
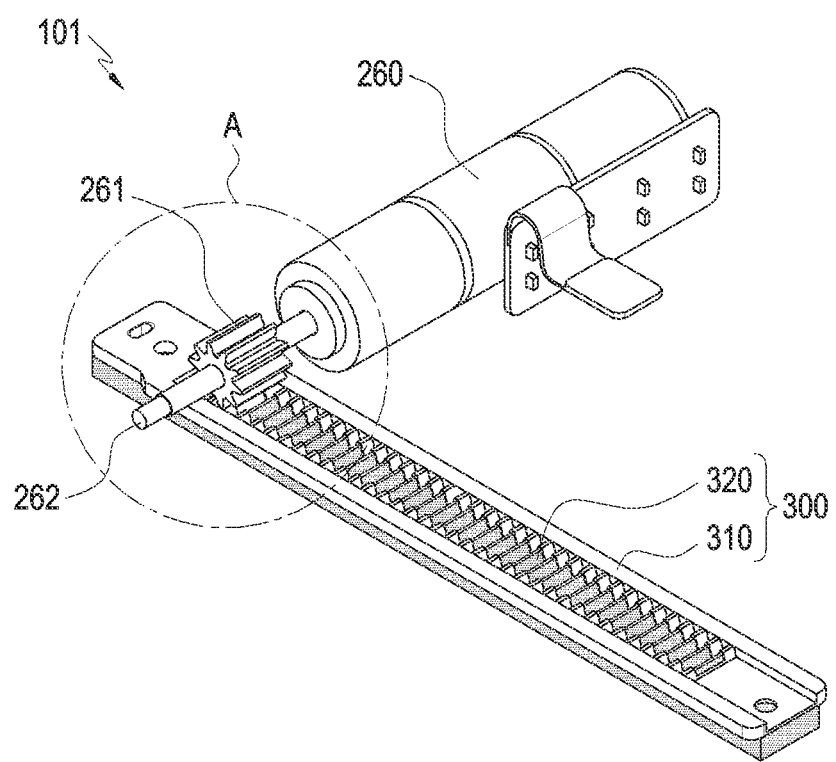
FIG. 7 is a perspective view of an electronic device including a motor structure, a pinion gear, and a rack gear according to an embodiment of the disclosure.
Figure 8:
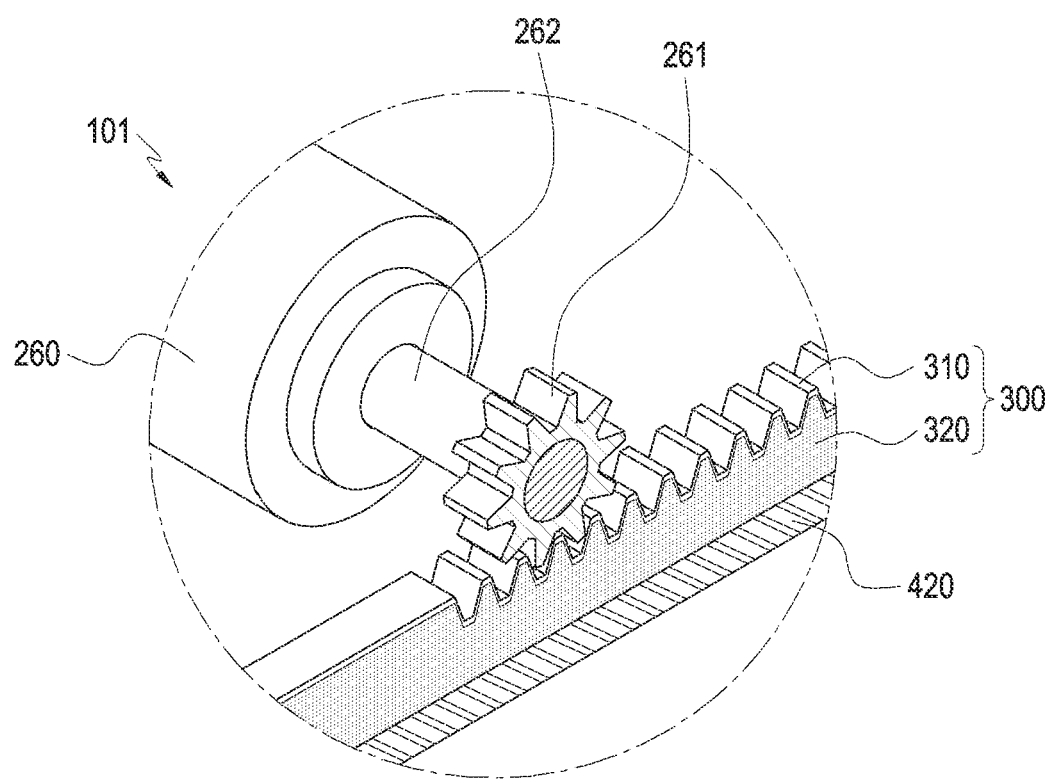
FIG. 8 is a magnified view of area A in FIG. 7 according to an embodiment of the disclosure.

FIG. 7 is a perspective view of an electronic device including a motor structure, a pinion gear, and a rack gear according to an embodiment of the disclosure. FIG. 8 is a magnified view of area A in FIG. 7 according to an embodiment of the disclosure.

The configuration of the motor structure 260, the pinion gear 261, the shaft structure 262, and the rack gear 300 in FIGS. 7 and/or 8 may be entirely or partially identical to the configuration of the motor structure 260, the pinion gear 261, the shaft structure 262, and the rack gear 300 in FIGS. 5 and/or 6.

According to an embodiment, the rack gear 300 may include a first part 310 and a second part 320. According to an embodiment, the first part 310 may be referred to as the upper part of the rack gear 300, and the second part 320 may be referred to as the lower part of the rack gear 300. For example, the first part 310 may be disposed on at least a part of the second part 320.

According to an embodiment, the first part 310 and the second part 320 may be made of different materials. According to an embodiment, the first part 310 and the second part 320 may be made of different materials such that the rack gear 300 maintains durability and have improved thermal conductivity.

According to an embodiment, the force received by the first part 310 from the pinion gear 261 may be larger than the force received by the second part 320 from the pinion gear 261, and the stiffness and/or strength of the first part 310 may be higher than the stiffness and/or strength of the second part 320. For example, first stiffness of a first material constituting at least a part of the first part 310 may be higher than second stiffness of a second material constituting at least a part of the second part 320. First strength of the first material may be higher than second strength of the second material.

According to an embodiment, the second part 320 may dissipate at least a part of heat generated by the motor structure 260. For example, heat generated by the motor structure 260 positioned in the first housing (for example, first housing 201 in FIG. 3) may be transferred to the second housing 202 by using at least a part (for example, second part 320) of the rack gear 300. According to an embodiment, thermal conductivity of the second part 320 may be higher than thermal conductivity of the first part 310. For example, the second material may have second thermal conductivity, and the first material may have first thermal conductivity lower than the second thermal conductivity. According to an embodiment, the first part 310 may include stainless steel and/or aluminum (Al). According to an embodiment, the second part 320 may include copper (Cu).

According to an embodiment, the electronic device 101 may include a heat dissipation member 420. The heat dissipation member 420 may be attached to the rack gear 300. For example, the heat dissipation member 420 may be disposed beneath the second part 320 of the rack gear 300.

According to an embodiment, third thermal conductivity of the heat dissipation member 420 may be larger than first thermal conductivity of the first part 310 and/or second thermal conductivity of the second part 320. According to an embodiment, the heat dissipation member 420 may include graphite. For example, the heat dissipation member 420 may be referred to as a graphite layer, a graphite sheet, and/or a graphite film.

Figure 9:
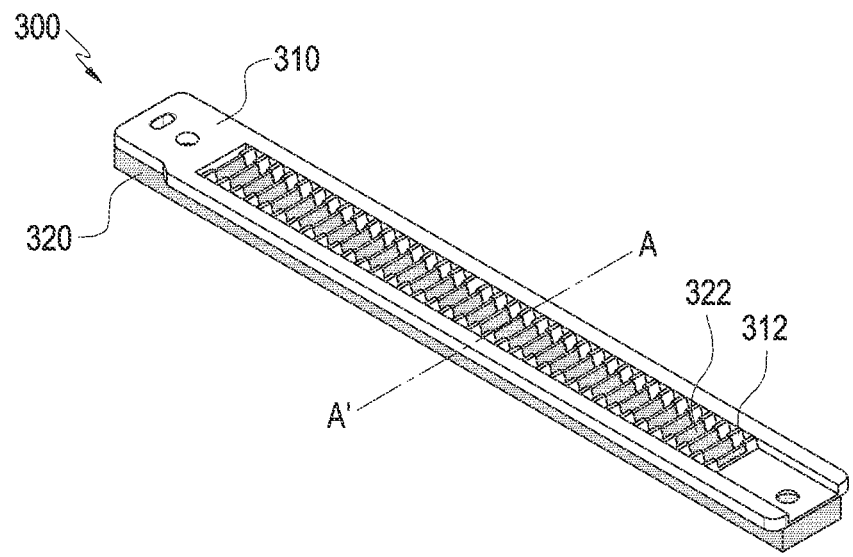
FIG. 9 is a perspective view of a rack gear according to an embodiment of the disclosure.
Figure 10A:
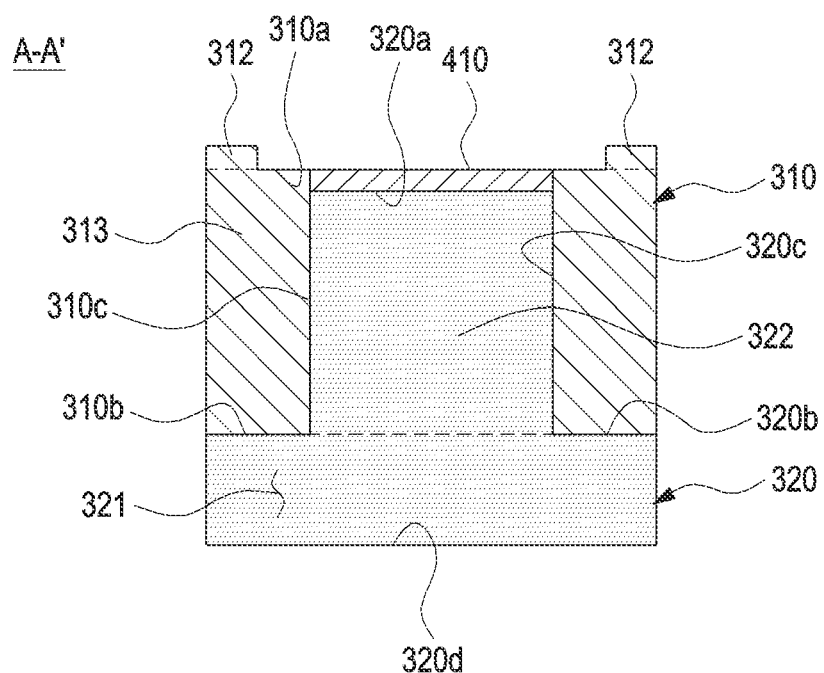
FIGS. 10A, 10B, and 10C are sectional views of surface A-A' in FIG. 9 according to various embodiments of the disclosure.
Figure 10B:
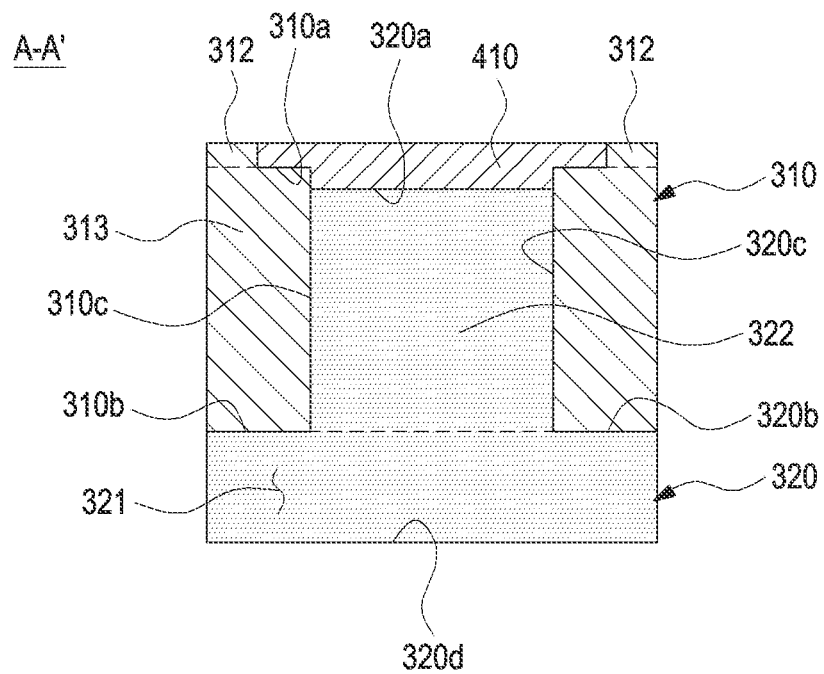
Figure 10C:
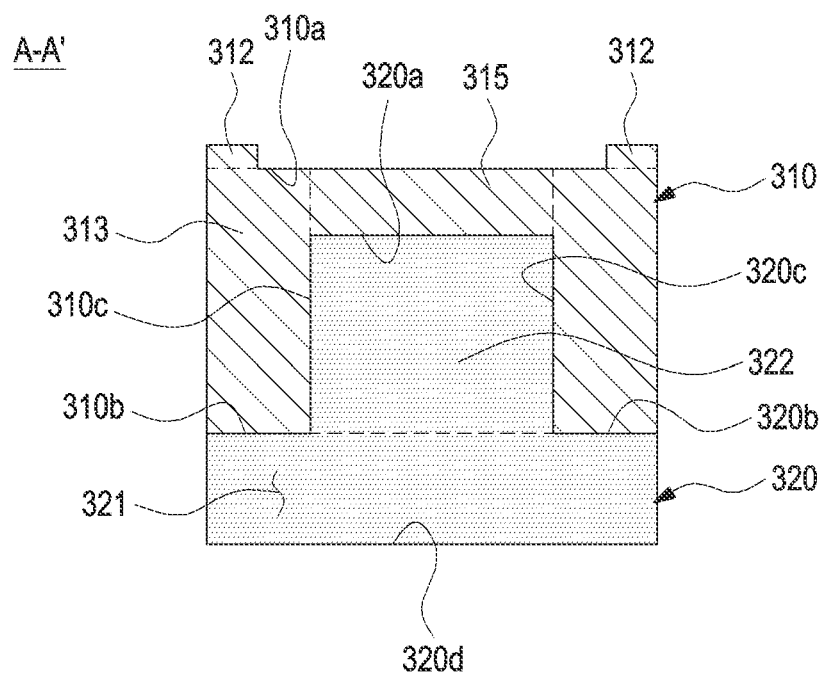
Figure 11:
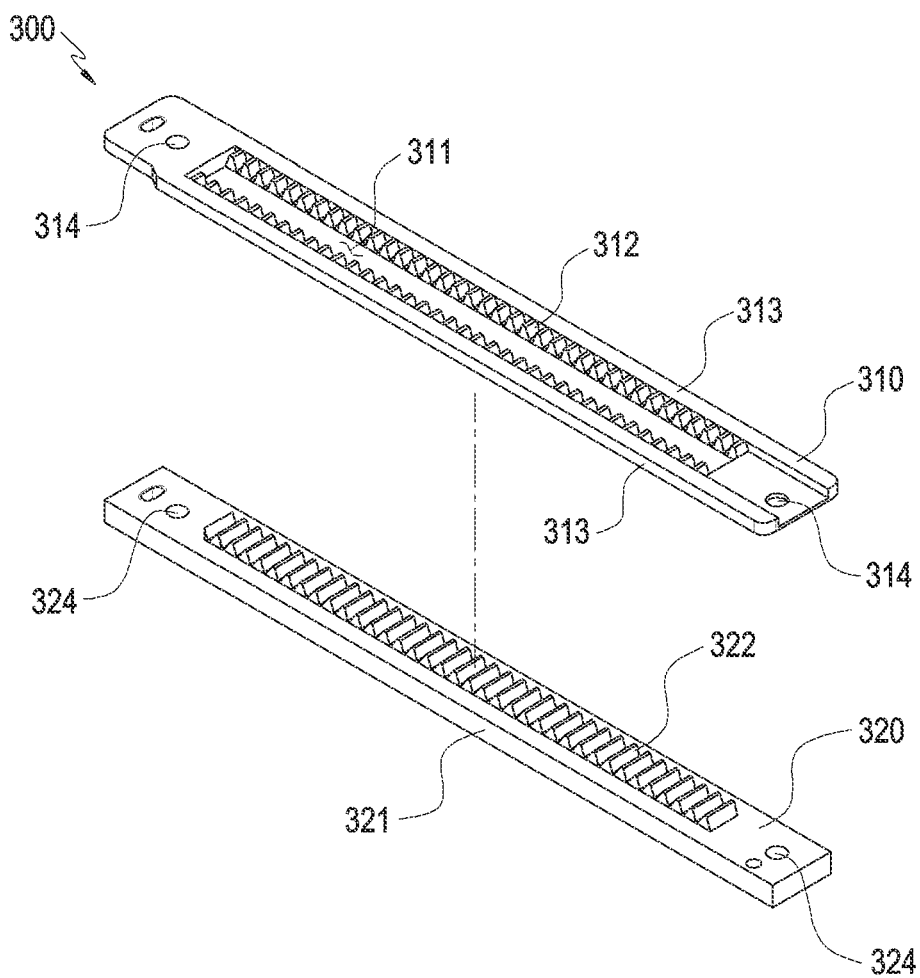
FIGS. 11 and 12 are exploded perspective views of a rack gear according to various embodiments of the disclosure.
Figure 12:
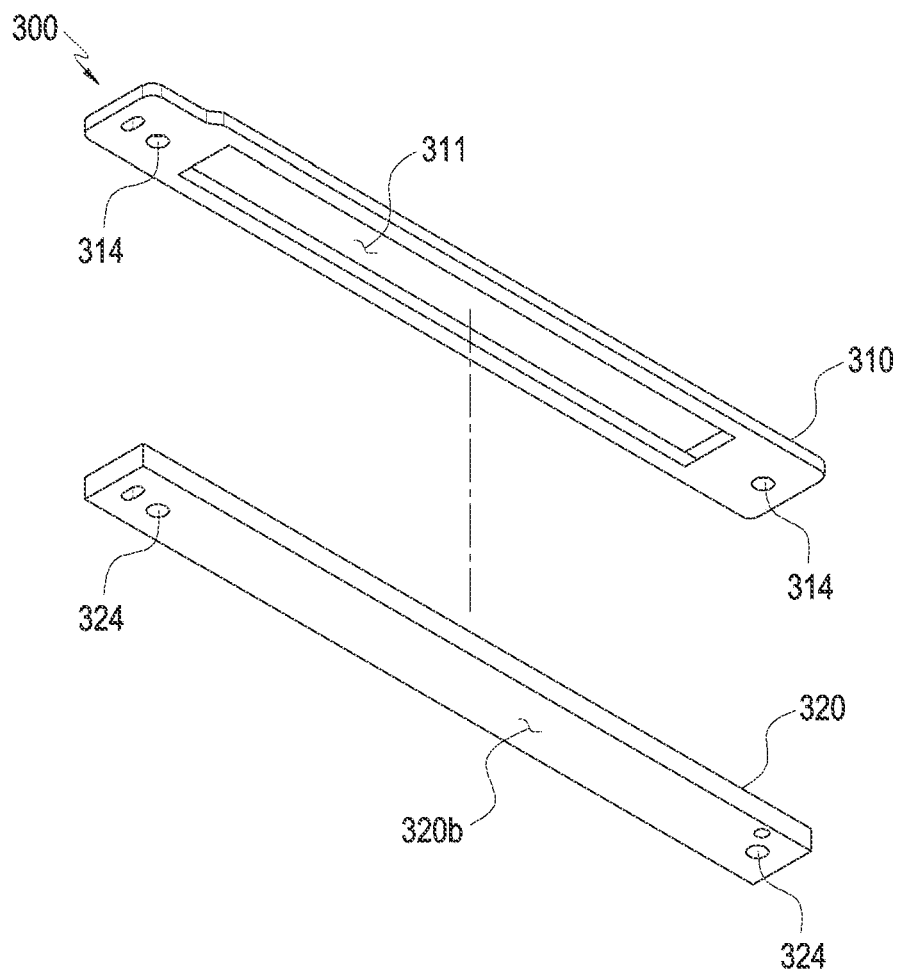

FIG. 9 is a perspective view of a rack gear according to an embodiment of the disclosure. FIGS. 10A to 10C are sectional views of surface A-A' in FIG. 9 according to an embodiment of the disclosure. FIGS. 11 and 12 are exploded perspective views of a rack gear according to an embodiment of the disclosure. For example, FIG. 11 is a front exploded perspective view of a rack gear 300, and FIG. 12 is a rear exploded perspective view of the rack gear 300.

Referring to FIGS. 9, 10A, 10B, 10C, 11, and/or 12, the rack gear 300 may include a first part 310 and a second part 320. The configuration of the rack gear 300 in FIGS. 9, 10A, 10B, 10C, 11, and/or 12 may be entirely or partially identical to the configuration of the rack gear 300 in FIGS. 7 and/or 8.

According to an embodiment, the rack gear 300 may mesh with a pinion gear (for example, pinion gear 261 in FIG. 7). For example, the rack gear 300 may receive at least a part of driving power generated by a motor structure (for example, motor structure 260 in FIG. 6) by using the pinion gear 261. According to an embodiment, first gear teeth 312 of the first part 310 and/or second gear teeth 322 of the second part 320 may contact least a part of the pinion gear 261.

According to an embodiment, the first part 310 may include at least one recess 311. The recess 311 may contain at least a part (for example, second gear teeth 322) of the second part 320. According to an embodiment, the recess 311 may be referred to as a through-hole or a groove.

According to an embodiment, the first part 310 may mesh with the pinion gear 261. For example, the first part 310 may include first gear teeth 312 contacting at least a part of the pinion gear 261. The first gear teeth 312 may be arranged along at least a part of the periphery of the recess 311.

According to an embodiment, the first part 310 may include a frame area 313. The frame area 313 may define a recess 311. For example, the recess 311 may be defined as an empty space formed in the frame area 313. According to an embodiment, the first gear teeth 312 may protrude or extend in the frame area 313.

According to an embodiment, the first part 310 may include a first surface 310a having at least a part facing the pinion gear 261. The first gear teeth 312 may extend or protrude on at least a part of the first surface 310a. According to another embodiment, the first surface 310a may be interpreted as a part of the first gear teeth 312. According to an embodiment, the first part 310 may include a second surface 310b opposite to the first surface 310a. The second surface 310b may face the second part 320. According to an embodiment, the first part 310 may include a third surface 310c defining a recess 311. For example, the third surface 310c may surround at least a part of the recess 311. The third surface 310c may extend from the first surface 310a to the second surface 310b. According to an embodiment, the first surface 310a may be interpreted as the upper surface of the frame area 313, the second surface 310b may be interpreted as the lower surface of the frame area 313, and the third surface 310c may be interpreted as the inner surface of the frame area 313.

According to an embodiment, at least a part of the second part 320 may be disposed below the first part 310. For example, the second part 320 may include a lower area 321 disposed below at least a part (for example, frame area 313) of the first part 310.

According to an embodiment, at least a part of the second part 320 may be contained in the recess 311 of the first part 310. For example, the second part 320 may include second gear teeth 322 at least partially contained in the recess 311. According to an embodiment, the second gear teeth 322 may extend or protrude in the lower area 321.

According to an embodiment, at least a part of the second part 320 may mesh with the pinion gear 261. For example, the second part 320 may include second gear teeth 322 contacting at least a part of the pinion gear 261.

According to an embodiment (for example, FIGS. 10A and/or 10B), the second part 320 may contact the pinion gear 261. For example, the recess 311 may be formed as a through-hole, and the second gear teeth 322 may contact the pinion gear 261 through the recess 311. According to an embodiment, at least a part of heat generated by the motor structure 260 may be directly transferred to the second part 320.

According to an embodiment (for example, FIG. 10C), the second part 320 may not contact the pinion gear 261. For example, the recess 311 may be formed as a groove, and the first part 310 may include a cover area 315 covering a part (for example, second gear teeth 322) of the second part 320. According to an embodiment, heat generated by the motor structure 260 may be transferred to the second part 320 via the first part 310.

According to an embodiment, the first part 310 may be connected to the second part 320. According to an embodiment, the first part 310 may include at least one first fastening hole 314, and the second part 320 may include at least one second fastening hole 324. The second fastening hole 324 may be positioned to correspond to the first fastening hole 314.

The first part 310 and the second part 320 may be fastened or connected by a fastening member (not illustrated) contained in the first fastening hole 314 and the second fastening hole 324. According to another embodiment, the first part 310 and the second part 320 may be connected by using an adhesive member (for example, adhesive agent and/or adhesive tape).

According to an embodiment, the second part 320 may include a fourth surface 320a, at least a part of which may face the pinion gear 261. The fourth surface 320a may be referred to as a part of the second gear teeth 322. According to an embodiment, the second part 320 may include a fifth surface 320b facing the second surface 310b of the frame area 313. The fifth surface 320b may be a part of the lower area 321. According to an embodiment, the second part 320 may include a sixth surface 320c facing the third surface 310c. The sixth surface 320c may extend from the fourth surface 320a to the fifth surface 320b. According to an embodiment, the second part 320 may include a seventh surface 320d opposite to the fourth surface 320a. According to an embodiment, a heat dissipation member (for example, heat dissipation member 420 in FIG. 6) may be disposed on the seventh surface 320d.

According to an embodiment, the first gear teeth 312 may be positioned above the second gear teeth 322. For example, the distance between the first gear teeth 312 and the pinion gear 261 may be smaller than the distance between the second gear teeth 322 and the pinion gear 261. Since the first gear teeth 312 are closer to the pinion gear 261 than the second gear teeth 322, the force provided to the first part 310 by the pinion gear 261 may be larger than the force provided to the second part 320 by the pinion gear 261. Since the first gear teeth 312 are close to the pinion gear 261 than the second gear teeth 322, the second gear teeth 322 having stiffness and/or strength lower than stiffness and/or strength of the first gear teeth 312 may be damaged less.

According to an embodiment, the electronic device (for example, electronic device 101 in FIG. 2) may include a lubricating material 410 disposed on the rack gear 300. According to an embodiment, the lubricating material 410 may increase the area of contact between the pinion gear 261 and the second gear teeth 322. According to an embodiment, the lubricating material 410 may be a fluid (for example, gel). According to an embodiment, the lubricating material 410 may include grease. According to an embodiment, the lubricating material 410 may include a thermal interface material (TIM). For example, at least a part of heat generated by the motor structure (for example, motor structure 260 in FIG. 6) may be transferred to the second part 320 of the rack gear 300 via the pinion gear 261 and the lubricating material 410.

According to an embodiment, the position in which the lubricating material 410 is disposed on the rack gear 300 may be variously changed.

Referring to FIG. 10A, the lubricating material 410 may be disposed on the second part 320. According to an embodiment, the lubricating material 410 may be applied onto the fourth surface 320a of the second part 320. According to an embodiment, at least a part of the lubricating material 410 may be surrounded by the third surface 310c of the first part 310 and the fourth surface 320a of the second part 320.

Referring to FIG. 10B, the lubricating material 410 may be disposed on the first part 310 and the second part 320. According to an embodiment, the lubricating material 410 may be applied onto the fourth surface 320a of the second part 320 and onto the first surface 310a of the first part 310. According to an embodiment, at least a part of the lubricating material 410 may be surrounded by the first gear teeth 312, the first surface 310a of the first part 310, third surface 310c of the first part 310, and the fourth surface 320a of the second part 320.

Figure 13:
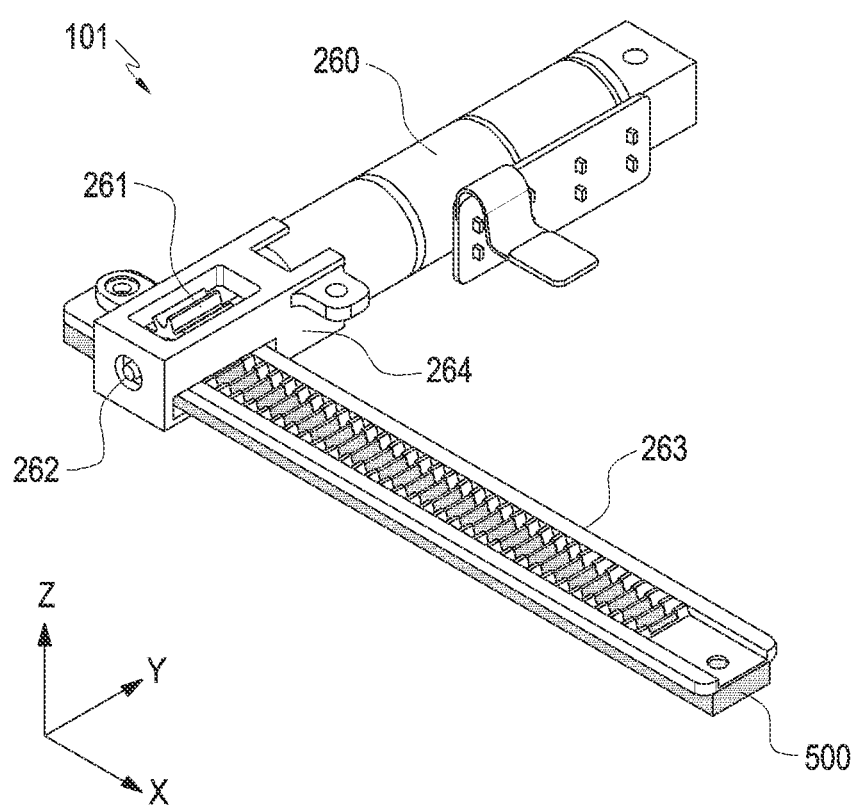
FIG. 13 is a perspective view of an electronic device including a heat transfer member according to an embodiment of the disclosure.
Figure 14:
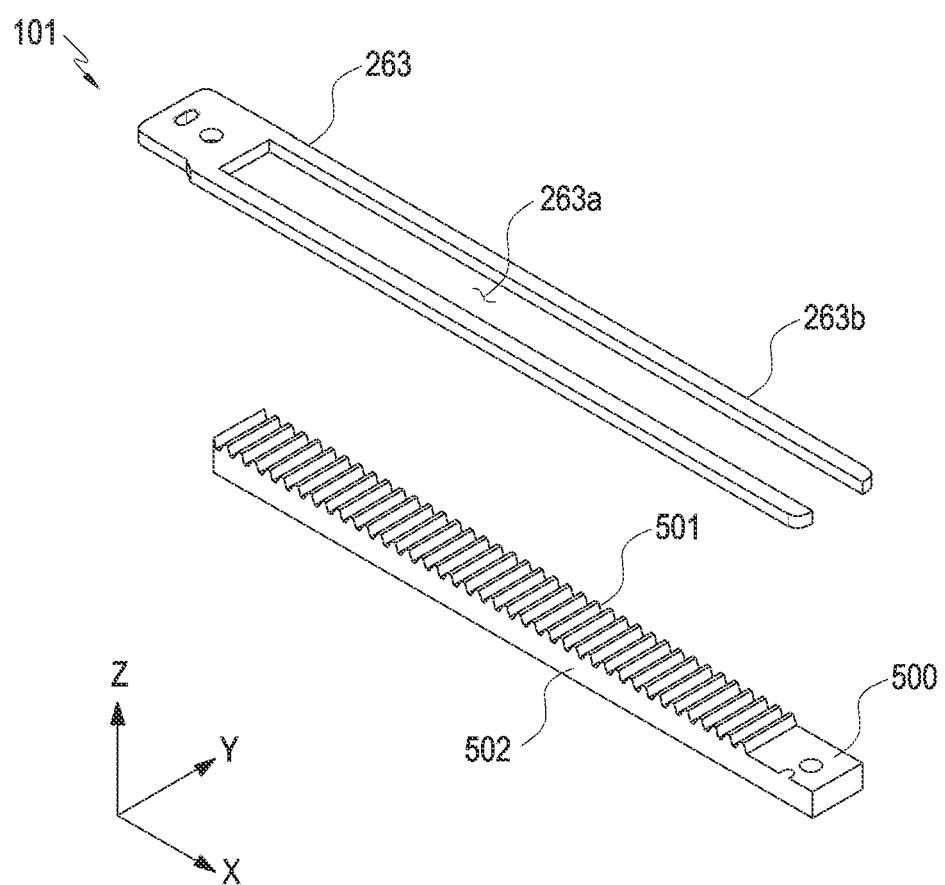
FIG. 14 is an exploded perspective view of an electronic device including a rack gear and a heat transfer member according to an embodiment of the disclosure.

FIG. 13 is a perspective view of an electronic device including a motor structure, a rack gear, and a heat transfer member according to an embodiment of the disclosure. FIG. 14 is an exploded perspective view of an electronic device including a rack gear and a heat transfer member according to an embodiment of the disclosure.

Referring to FIGS. 13 and/or 14, an electronic device 101 may include a motor structure 260, a pinion gear 261, and a shaft structure 262. The configuration of the motor structure 260, the pinion gear 261, and the shaft structure 262 in FIGS. 13 and/or 14 may be entirely or partially identical to the configuration of the motor structure 260, the pinion gear 261, and the shaft structure 262 in FIG. 7.

According to an embodiment, the electronic device 101 may include a heat transfer member 263. According to an embodiment, the heat transfer member 263 may surround at least a part of the rack gear 500. For example, the heat transfer member 263 may include a containing space 263a for containing the rack gear 500, and a support area 263b surrounding at least a part of the containing space 263a. According to an embodiment, the support area 263b may extend along the sliding direction (for example, X-axis direction) of the electronic device 101. According to an embodiment, the heat transfer member 263 may include a material for improving heat transfer (for example, copper (Cu) and/or graphite). According to an embodiment, the heat transfer member 263 may contact the gear bracket 264 and the rack gear 500. According to an embodiment, the heat transfer member 263 may be referred to as a rack gear bracket.

According to an embodiment, the electronic device 101 may include a gear bracket 264 surrounding at least a part of the pinion gear 261 and/or at least a part of the shaft structure 262. According to an embodiment, the gear bracket 264 may include a material for improving heat transfer (for example, copper (Cu)). According to an embodiment, the gear bracket 264 may be connected to the motor structure 260, the heat transfer member 263, and the rack gear 500. According to an embodiment, at least a part of heat generated by the motor structure 260 may be transferred to the rack gear 500 through the gear bracket 264 and/or the heat transfer member 263.

According to an embodiment, the configuration of the rack gear 500 in FIGS. 12 and/or 13 may be entirely or partially identical to the configuration of the rack gear 300 in FIG. 9. For example, the rack gear 500 may include a gear frame 502 and gear teeth 501 extending form the gear frame 502. The gear teeth 501 may mesh with a pinion gear (for example, pinion gear 261 in FIG. 8). According to an embodiment, the rack gear 500 may include a first part (for example, first part 310 in FIG. 8) and a second part (for example, second part 320 in FIG. 8) made of different materials. According to another embodiment, the rack gear 500 may be made of a substantially identical material. For example, heat generated by the motor structure 260 may be dissipated to the rack gear 500 by using the heat transfer member 263.

An electronic device (for example, portable terminal) may include a display having a flat surface or a flat surface and a curved surface. An electronic device including a display may have restrictions on implementing a screen larger than the size of the electronic device, due to the fixed display structure. Therefore, there has been research regarding electronic devices including a rollable display.

Electronic devices have become compact and lightweight to maximize portability and convenience for users, and have been equipped with integrated components in gradually decreasing spaces, for high performance. Therefore, high-performance components used for electronic devices have higher heating temperatures, and heat generated by components in electronic devices may affect adjacent components, thereby degrading overall performance of electronic devices.

In connection with implementing a rollable electronic device, there may be difficulty in securing a heat dissipation structure while allowing structures of the electronic device to move (for example, slide) relative to each other. For example, a rollable electronic device requires a space in which the display can slide or a mechanical element for sliding of the display, and it may thus be difficult to secure a heat dissipation structure for the rollable electronic device while securing portability of the electronic device through compactness.

An embodiment of the disclosure may provide an electronic device including a rack gear capable of dissipating heat generated by a motor structure.

Problems to be solved by the disclosure are not limited to the above-mentioned problems, and may be variously expanded without deviating from the idea and scope of the disclosure.

According to an embodiment of the disclosure, an electronic device may dissipate heat generated by a motor structure by using a rack gear including a first part made of a material having a relatively high level of rigidity and a second part made of a material having a relatively high level of thermal conductivity.

Various other advantageous effects identified explicitly or implicitly through the disclosure may be provided.

According to an embodiment of the disclosure, an electronic device may include a housing (for example, housing 200 in FIG. 3) including a first housing (for example, first housing 201 in FIG. 3) and a second housing (for example, second housing 202 in FIG. 3) configured to contain at least a part of the first housing and to move relative to the first housing, a display (for example, display 203 in FIG. 3) configured to unfold based on sliding of the first housing, a motor structure (for example, motor structure 260 in FIG. 7) disposed in the housing and configured to generate driving power for sliding of the first housing, a pinion gear (for example, pinion gear 261 in FIG. 7) configured to rotate based on the driving power generated by the motor structure 260, and a rack gear (for example, rack gear 300 in FIG. 7) disposed in the housing and configured to mesh with the pinion gear. The rack gear may include a first part (for example, first part 310 in FIG. 11) made of a first material, the first part including at least one recess (for example, first recess 311 in FIG. 11), and a second part (for example, second part 320 in FIG. 11) including a lower area (for example, lower area 321 in FIG. 11) disposed below the first part, at least a part of the second part being contained in the at least one recess, the second part being made of a second material different from the first material.

According to an embodiment, the second part may include second gear teeth (for example, second gear teeth 322 in FIG. 11) extending in the lower area, the second gear teeth being at least partially positioned in the at least one recess and configured to contact the pinion gear.

According to an embodiment, the first part may include a first surface (for example, first surface 310*a* in FIG. 10A) facing the pinion gear, a second surface (for example, second surface 310*b* in FIG. 10A) opposite to the first surface, and a third surface (for example, third surface 310*c* in FIG. 10A) extending from the first surface to the second surface, the third surface defining the at least one recess. The second part may include a fourth surface (for example, fourth surface 320*a* in FIG. 10A) facing the pinion gear, a fifth surface (for example, fifth surface 320*b* in FIG. 10A) facing the second surface, and a sixth surface (for example, sixth surface 320*c* in FIG. 10A) extending from the fourth surface to the fifth surface, the sixth surface facing the third surface.

According to an embodiment, the electronic device may further include a lubricating material (for example, lubricating material 410 in FIG. 10A) applied onto the second part and configured to contact the pinion gear.

According to an embodiment, second thermal conductivity of the second material may be higher than first thermal conductivity of the first material.

According to an embodiment, the first part may include first gear teeth (for example, first gear teeth 312 in FIG. 9) configured to at least partially mesh with the pinion gear, the second part may include second gear teeth (for example, second gear teeth 322 in FIG. 9) configured to at least partially mesh with the pinion gear, and the first gear teeth may be at least partially positioned closer to the pinion gear than the second gear teeth.

According to an embodiment, the first gear teeth may be arranged to surround at least a part of the at least one recess.

According to an embodiment, the first material may include at least one of stainless steel or aluminum, and the second material may include copper.

According to an embodiment, first stiffness of the first material may be higher than second stiffness of the second material, and first strength of the first material may be higher than second strength of the second material.

According to an embodiment, the motor structure may be connected to the first housing, and the rack gear may be connected to the second housing.

According to an embodiment, the electronic device may further include a heat dissipation member (for example, heat dissipation member 420 in FIG. 8) attached to the second part, the heat dissipation member including graphite.

According to an embodiment, the motor structure may include a shaft structure (for example, shaft structure 262 in FIG. 8) connected to the pinion gear, and the shaft structure may include copper.

According to an embodiment, the electronic device may further include a gear bracket (for example, gear bracket 264 in FIG. 13) connected to the motor structure and configured to surround at least a part of the pinion gear, and a heat transfer member (for example, heat transfer member 263 in FIG. 13) connected to the gear bracket and the rack gear.

According to an embodiment, the electronic device may further include a battery (for example, battery 189 in FIG. 5) configured to supply power to the motor structure, and the housing may include at least one slit (for example, slit 205 in FIG. 5) positioned between the motor structure and the battery.

According to an embodiment, the display may include a first display area (for example, first display area A1 in FIG. 4) connected to the second housing and a second display area (for example, second display area A2 in FIG. 4) connected to the first housing, and the electronic device may further include a display support member (for example, display support member 213 in FIG. 4) configured to support the second display area.

According to an embodiment of the disclosure, an electronic device (for example, electronic device 101 in FIG. 3) may include a housing (for example, housing 200 in FIG. 3) including a first housing (for example, first housing 201 in FIG. 3) and a second housing (for example, second housing 202 in FIG. 3) configured to contain at least a part of the first housing and to move relative to the first housing, a display (for example, display 203 in FIG. 3) configured to unfold based on sliding of the first housing, a motor structure (for example, motor structure 260 in FIG. 7) disposed in the housing and configured to generate driving power for sliding of the first housing, a pinion gear (for example, pinion gear 261 in FIG. 6) configured to rotate based on the driving power generated by the motor structure, and a rack gear (for example, rack gear 300 in FIG. 7) disposed in the housing and configured to mesh with the pinion gear. The rack gear may include a first part (for example, first part 310 in FIG. 9) made of a first material having first thermal conductivity, the first part including a through-hole and first gear teeth (for example, first gear teeth 312 in FIG. 9) arranged on a periphery of the through-hole, and a second part (for example, second part 320 in FIG. 9) made of a second material having second thermal conductivity higher than the first thermal conductivity, the second part including a lower area disposed below the first part and second gear teeth (for example, second gear teeth 322 in FIG. 9) extending in the lower area, the second gear teeth being at least partially contained in the through-hole.

According to an embodiment, the electronic device may further include a lubricating material (for example, lubricating material 410 in FIG. 10A) applied onto the second part and configured to contact the pinion gear.

According to an embodiment, the first gear teeth may be at least partially positioned closer to the pinion gear than the second gear teeth.

According to an embodiment, the first material may include at least one of stainless steel or aluminum, and the second material may include copper.

According to an embodiment, the electronic device of claim may further include a heat dissipation member (for example, heat dissipation member 420 in FIG. 8) attached to the second part, the heat dissipation member including graphite.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
    a housing comprising a first housing and a second housing configured to accommodate at least a part of the first housing and to move relative to the first housing;
    a display configured to unfold based on sliding of the first housing;
    a motor structure disposed in the housing and configured to generate driving power for sliding of the first housing;
    a pinion gear configured to rotate based on the driving power generated by the motor structure; and
    a rack gear disposed in the housing and configured to mesh with the pinion gear,
    wherein the rack gear comprises:
        a first part made of a first material having a first thermal conductivity, the first part comprising at least one recess and first gear teeth configured to at least partially mesh with the pinion gear, and
        a second part comprising a lower area disposed below the first part, at least a part of the second part being accommodated in the at least one recess, the second part being made of a second material having a second thermal conductivity higher than the first thermal conductivity.

2. The electronic device of claim 1, wherein the second part comprises second gear teeth extending in the lower area, the second gear teeth being at least partially positioned in the at least one recess and configured to contact the pinion gear.

3. The electronic device of claim 1, wherein the first part comprises a first surface facing the pinion gear, a second surface opposite to the first surface, and a third surface extending from the first surface to the second surface, the third surface defining the at least one recess, and
    wherein the second part comprises a fourth surface facing the pinion gear, a fifth surface facing the second surface, and a sixth surface extending from the fourth surface to the fifth surface, the sixth surface facing the third surface.

4. The electronic device of claim 3, further comprising a lubricating material applied onto the second part and configured to contact the pinion gear.

5. The electronic device of claim 1,
    wherein the second part comprises second gear teeth configured to at least partially mesh with the pinion gear, and
    wherein the first gear teeth are at least partially positioned closer to the pinion gear than the second gear teeth.

6. The electronic device of claim 5, wherein the first gear teeth are arranged to surround at least a part of the at least one recess.

7. The electronic device of claim 1,
    wherein the first material comprises at least one of stainless steel or aluminum, and
    wherein the second material comprises copper.

8. The electronic device of claim 1,
    wherein first stiffness of the first material is higher than second stiffness of the second material, and wherein first strength of the first material is higher than second strength of the second material.

9. The electronic device of claim 1, wherein the motor structure is connected to the first housing, and
wherein the rack gear is connected to the second housing.

10. The electronic device of claim 1, further comprising a heat dissipation member attached to the second part, the heat dissipation member comprising graphite.

11. The electronic device of claim 1,
wherein the motor structure comprises a shaft structure connected to the pinion gear, and
wherein the shaft structure comprises copper.

12. The electronic device of claim 1, further comprising:
a gear bracket connected to the motor structure and configured to surround at least a part of the pinion gear; and
a heat transfer member connected to the gear bracket and the rack gear.

13. The electronic device of claim 1, further comprising a battery configured to supply power to the motor structure,
wherein the housing comprises at least one slit positioned between the motor structure and the battery.

14. The electronic device of claim 1,
wherein the display comprises a first display area connected to the second housing and a second display area connected to the first housing, and
wherein the electronic device further comprises a display support member configured to support the second display area.

15. An electronic device comprising:
a housing comprising a first housing and a second housing configured to accommodate at least a part of the first housing and to move relative to the first housing;
a display configured to unfold based on sliding of the first housing;
a motor structure disposed in the housing and configured to generate driving power for sliding of the first housing;
a pinion gear configured to rotate based on the driving power generated by the motor structure; and
a rack gear disposed in the housing and configured to mesh with the pinion gear,
wherein the rack gear comprises:
a first part made of a first material having first thermal conductivity, the first part comprising a through-hole and first gear teeth arranged on a periphery of the through-hole, and
a second part made of a second material having second thermal conductivity higher than the first thermal conductivity, the second part comprising a lower area disposed below the first part and second gear teeth extending in the lower area, the second gear teeth being at least partially accommodated in the through-hole.

16. The electronic device of claim 15, further comprising a lubricating material applied onto the second part and configured to contact the pinion gear.

17. The electronic device of claim 15, wherein the first gear teeth are at least partially positioned closer to the pinion gear than the second gear teeth.

18. The electronic device of claim 15,
wherein the first material comprises at least one of stainless steel or aluminum, and
wherein the second material comprises copper.

19. The electronic device of claim 15, further comprising a heat dissipation member attached to the second part, the heat dissipation member comprising graphite.

20. The electronic device of claim 1,
wherein the first part comprises at least one first fastening hole and the second part comprises at least one second fastening hole positioned to align with the at least one first fastening hole, and
wherein the first part is connected to the second part via the at least one first fastening hole and the at least one second fastening hole.

* * * * *